(12) United States Patent
Takahashi et al.

(10) Patent No.: US 7,994,860 B2
(45) Date of Patent: Aug. 9, 2011

(54) ELECTRONIC COMPONENT FOR HIGH FREQUENCY POWER AMPLIFICATION

(75) Inventors: Kyoichi Takahashi, Tokyo (JP);
Kazuhiro Koshio, Tokyo (JP); Satoshi Tanaka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 9 days.

(21) Appl. No.: 12/565,993

(22) Filed: Sep. 24, 2009

(65) Prior Publication Data

US 2010/0102887 A1 Apr. 29, 2010

(30) Foreign Application Priority Data

Oct. 24, 2008 (JP) ................................ 2008-274801

(51) Int. Cl.
*H03G 3/30* (2006.01)
(52) U.S. Cl. ........................................ 330/285; 330/140
(58) Field of Classification Search .................. 330/133, 330/140, 285
See application file for complete search history.

(56) References Cited

U.S. PATENT DOCUMENTS

| 7,352,244 B2 | 4/2008 | Takahashi et al. |
| 2006/0192616 A1* | 8/2006 | Takahashi et al. ............ 330/141 |

FOREIGN PATENT DOCUMENTS

| JP | 2005-197859 A | 7/2005 |
| JP | 2006-238244 A | 9/2006 |

* cited by examiner

*Primary Examiner* — Steven J Mottola
(74) *Attorney, Agent, or Firm* — Mattingly & Malur, PC

(57) ABSTRACT

An electronic component for high frequency power amplification realizes an improvement in switching spectrum characteristics. The gain of an amplifying NMOS transistor is controlled by a bias voltage on which a bias control voltage is reflected. Further, a threshold voltage compensator compensates for a variation in threshold voltage with variations in the manufacture of the amplifying NMOS transistor. The threshold voltage compensator includes an NMOS transistor formed in the same process specification as the amplifying NMOS transistor and converts a variation in current flowing through the NMOS transistor depending on the variation in the threshold voltage of the amplifying NMOS transistor to its corresponding voltage by a resistor to compensate for the bias voltage. It is thus possible to reduce variations in so-called precharge level brought to fixed output power in a region (0 dBm or less, for example) low in output power.

9 Claims, 14 Drawing Sheets

ELECTRONIC COMPONENT FOR HIGH FREQUENCY POWER AMPLIFICATION

CROSS-REFERENCE TO RELATED APPLICATIONS

The disclosure of Japanese Patent Application No. 2008-274801 filed on Oct. 24, 2008 including the specification, drawings and abstract is incorporated herein by reference in its entirety.

BACKGROUND OF THE INVENTION

The present invention relates to an electronic component for high frequency power amplification, and particularly to a technology effective when applied to an electronic component for high frequency power amplification, which needs power-up characteristics at the start of transmission with a GSM cellular phone or the like as a representative.

A high frequency power amplifying electronic component (hereinafter called "RF power amplifier module") equipped with a high power amplifier (HPA) with transistors such as a MOSFET (Metal Oxide Semiconductor Field-Effect-Transistor), a GaAs-MESFET, etc. as amplifying elements has been built in a transmission section of a wireless communication apparatus such as a cellular phone or the like. In general, a system is configured in a cellular phone in such a manner that the cellular phone performs call processing while changing output power (transmission power) so as to adapt to ambient environments in accordance with power level indication information sent from a base station, and does not cause interference with other cellular phones. In a cellular phone of a GSM (Global System for Mobile Communication), for example, an APC (Automatic Power Control) circuit is mounted in an RF power amplifier module. The APC circuit compares a detected signal of an output signal and an output level indication signal Vramp sent from a baseband circuit and controls transmission power by control on the gain of each amplifying stage. Regarding such an RF power amplifier module, the following technologies have been known.

A high power amplifier in which a bias control voltage Vapc for defining transmission power is applied to respective gates of power amplifying MOS transistors coupled in tandem in three stages, via resistance division has been shown in, for example, FIG. 2 of a patent document 1 (Japanese Unexamined Patent Publication No. 2005-197859). The high power amplifier is further provided with a MOS transistor (Q1) having the same structure as the power amplifying MOS transistor and has the function of converting a current flowing through the MOS transistor (Q1) to its corresponding voltage by a resistor (R6) and reflecting it on the bias control voltage Vapc. According to this, since the manufacturing variations in the threshold voltage of the power amplifying MOS transistor are monitored by the MOS transistor (Q1) and reflected on the bias control voltage Vapc, variations in bias current of the power amplifying MOS transistor can be compensated.

An electronic component for high frequency power amplification in which a bias current corresponding to a bias control voltage Vapc for defining transmission power is supplied to an amplifying transistor (Qa3) via a current mirror circuit (Qa3, Qb3), has been shown in, for example, FIG. 3 of a patent document 2 (Japanese Unexamined Patent Publication No. 2006-238244). The electronic component is further provided with a precharge function that a bias current set to a fixed value is supplied to the amplifying transistor (Qa3) at low power with the rise of power. Described specifically, the current (current corresponding to the bias control voltage Vapc) flowing through the amplifying transistor (Qa3) is detected by a current detector 224, and its voltage-converted value and a reference voltage Vpre are compared with each other. When the voltage-converted value is small, the bias control voltage Vapc is raised via a transistor (Qe). On the other hand, when the voltage-converted value is large, the transistor Qe is turned off so that a bias control voltage Vapc is generated according to an output level indication signal Vramp and a detected signal (Vdet) sent from a power detector (221). According to this, the precharge function can be realized by hardware and an improvement in spectrum characteristics with the rise of power can easily be realized.

SUMMARY OF THE INVENTION

Switching spectrum characteristics have been defined as one portable terminal standard for GMSK (Gaussian filtered Minimum Shift Keying) typified by a GSM, for example. As a technology for improving the switching spectrum characteristics, a precharge function for setting output power of an RF power amplifier module to a low power level (normally 0 dBm or less, typically within a range from −30 dBm to −10 dBm) once and then raising it has been known as shown in, for example, the patent document 2.

FIG. 13 is a block diagram showing a schematic configuration example of an electronic component for high frequency power amplification, which has been examined as a premise of the present invention. The electronic component shown in FIG. 13 is configured in a manner similar to the patent document 2, for example. The electronic component comprises a high power amplifier HPA for amplifying a high frequency input signal RFin and generating a high frequency output signal Pout, and an automatic power controller APC for performing its gain control. The automatic power controller APC includes a power control loop PWC_LP and a precharge loop PRE_LP. In the power control loop PWC_LP, output power of the high frequency output signal Pout is detected by a power detector (coupler) CPL. The so-detected power is outputted as a detected voltage signal Vdet via a power/current converter PIC and an I/V conversion rectifier IVCR. An output level indication signal Vramp sent from a baseband circuit (not shown) and the detected voltage signal Vdet are compared by an error amplifier block EA_BLK. A bias control voltage Vapc is controlled depending on the result of comparison. Incidentally, the bias control voltage Vapc is converted to a bias voltage or current of an unillustrated amplifying transistor, whereby the output power is controlled.

On the other hand, in the precharge loop PRE_LP, a current generator CGEN generates a current signal proportional to the magnitude of the bias control voltage Vapc. An I/V converter IVC converts the current signal to a voltage signal Vmoni. The voltage signal Vmoni and a reference voltage Vpre are compared by an amplifier circuit AMP2, and the bias control voltage Vapc is controlled depending on the result of comparison via a precharge transistor Qpe. Here, the reference voltage Vpre has a voltage value for setting the power level of the high frequency output signal Pout to within the range from −30 dBm to −10 dBm, for example. When the voltage signal Vmoni is smaller than the reference voltage Vpre, the bias control voltage Vapc is raised to a predetermined fixed level via the precharge transistor Qpe. When the voltage signal Vmoni is larger than the reference voltage Vpre, the precharge transistor Qpe is turned off so that the bias control voltage Vapc is controlled by the power control loop PWC_LP. Since the detection of power by the power detector CPL is difficult in a low power level (precharge level) range in which the power level ranges from −30 dBm to −10 dBm, for example, the loop control on the precharge level is performed using the current generator CGEN in this way.

When the precharge level falls out of such a set range as mentioned above, the switching spectrum characteristics are degraded in such a configuration. There has therefore been a demand for a technology for generating precharge levels reduced in variation wherever possible. It has however been revealed by examinations of the present inventors et al. that variations in the precharge level occur due to the following factors, for example, and a margin for the above set range cannot be ensured. FIGS. 14A and 14B typically show factors in variations of precharge levels of the electronic component examined as the premise of the present invention, in which FIG. 14A is an explanatory diagram where a current control type is used, and FIG. 14B is an explanatory diagram where a voltage control type is used. Such a precharge function as shown in FIG. 13 conceptually sets an output level indication signal Vramp to a fixed value V'pre at a low power level as shown in each of FIGS. 14A and 14B. When the threshold voltage Vth of the amplifying transistor varies, a rise starting point of Pout relative to Vramp is shifted as shown in each of FIGS. 14A and 14B.

(1) When such a configuration (hereinafter referred to as "current control type") that gain control of the power amplifier is performed by current control based on the current mirror circuit is used as shown in the patent document 2, for example, the influence of manufacturing variations in the threshold voltage of the amplifying transistor can be reduced. Since, however, a power control slope is large, variations in precharge level cannot be reduced eventually. Namely, when a power control slope ($\Delta$Pout/$\Delta$Vramp) is large even if a variation in Vth is small as shown in FIG. 14A, the precharge level greatly varies in a range of Ppre_H to Ppre_L with respect to the fixed value V'pre. There is also a fear that when the current control type is used, a mirror current becomes small at a low power level and a response delay time increases correspondingly.

(2) When such a configuration (hereinafter referred to as "voltage control type") that a bias voltage is applied to the gate of an amplifying transistor via resistance division thereby to perform gain control on a power amplifier is used as shown in the patent document 1, for example, a power control slope can be rendered small but the influence of manufacturing variations in threshold voltage becomes large, so that variations in precharge level cannot be reduced. Namely, when a variation in the threshold voltage Vth is large even if a power control slope is small as shown in FIG. 14B, the precharge level greatly varies in a range of Ppre_H to Ppre_L with respect to the fixed value V'pre. Incidentally, there can be obtained an advantage that when the voltage control type is used, a response delay time at a low power level can be reduced because of voltage driving.

It is therefore considered that as described in the patent document 1, for example, the voltage control type is used and there is provided a circuit for compensating for the variations in the threshold voltage Vth. The compensator shown in the patent document 1 is however in danger of developing difficulty in high accurate compensation for the threshold voltage Vth where manufacturing variations in resistance (R6 in FIG. 2 of the patent document 1) occur. Further, while the technology of the patent document 1 aims to perform compensation over all power regions without aiming to compensate for the variations in precharge level, the variation in Vth are not much of a large problem because output power is actually detected to perform APC control in power regions of middle to high levels. Thus, the use of the current control type configuration in all states of amplifying stages is considered desirable unless the variations in the precharge level are taken into consideration.

The present invention has been made in view of the foregoing. An object of the present invention is to provide an electronic component for high frequency power amplification, which is capable of implementing an improvement in switching spectrum characteristics. The above and other objects and novel features of the present invention will become apparent from the description of the present specification and the accompanying drawings.

A summary of representative embodiments of the inventions disclosed in the present application will be described in brief as follows:

An electronic component for high frequency power amplification according to the present embodiment has a first transistor to which a bias voltage corresponding to a bias control signal (Vapc) is applied and which performs an amplifying operation of a high frequency signal, and a compensator which compensates for a process variation (variations in threshold voltage, for example) of the first transistor in addition to a power control loop and a precharge circuit for controlling the bias control signal Vapc. The power control loop detects output power of the first transistor and compares the output power and an output level indication signal (Vramp) inputted from outside thereby to control the bias control signal Vapc. The precharge circuit controls the bias control signal Vapc in such a manner that the output power becomes a fixed value in a range (0 dBm or less, for example) in which the value of the output power becomes small up to such an extent as to be undetectable sufficiently in power. The compensator includes a monitoring transistor formed in the same process specification as the first transistor, and detects a change in electrical characteristics with a process variation produced even in the monitoring transistor in a manner similar to the first transistor and compensates for a bias voltage based on its detected signal.

Using such a configuration makes it possible to reduce variations in output power (precharge level) fixed by the precharge circuit. With its reduction, an improvement in switching spectrum characteristics can be implemented. Namely, the above advantageous effect is obtained by using the configuration (voltage control type configuration) for controlling the gain of the first transistor by the bias voltage thereby to reduce its power control slope and additionally compensating for an influence with variations in threshold voltage, indicative of a demerit of the voltage control type.

An electronic component for high frequency power amplification according to the present embodiment comprises a plurality of stages of amplifier units coupled in tandem. The voltage control type configuration and the compensator referred to above are applied to the amplifier unit of the final stage, and a current control type configuration is applied to the amplifier unit of the first stage. In the current control type configuration, a control transistor that configures a current mirror circuit together with an amplifying transistor is coupled to the amplifying transistor. A current of the control transistor is controlled to control a bias current of the amplifying transistor. Thus, applying the current control type configuration to at least the amplifier unit of the first stage and applying the voltage control type configuration subjected to the compensation for the threshold voltage to the amplifier unit of the final stage make it possible to further realize stable power characteristics (i.e., power control high in accuracy with respect to an output level indication signal (Vramp)) in all power regions of low to high levels in addition to such an advantageous effect as mentioned above.

Advantageous effects obtained by representative embodiments of the inventions disclosed in the present application will be explained in brief. It is possible to achieve the stabilization of a precharge level and implement an improvement in switching spectrum characteristics.

BRIEF DESCRIPTION OF THE DRAWINGS

FIGS. 14A and 14B typically show factors in variations of precharge levels of an electronic component for high frequency power amplification examined as a premise of the present invention, in which FIG. 14A is an explanatory diagram where a current control type is used, and FIG. 14B is an explanatory diagram where a voltage control type is used.

DETAILED DESCRIPTION OF THE PREFERRED EMBODIMENTS

Figure 1:
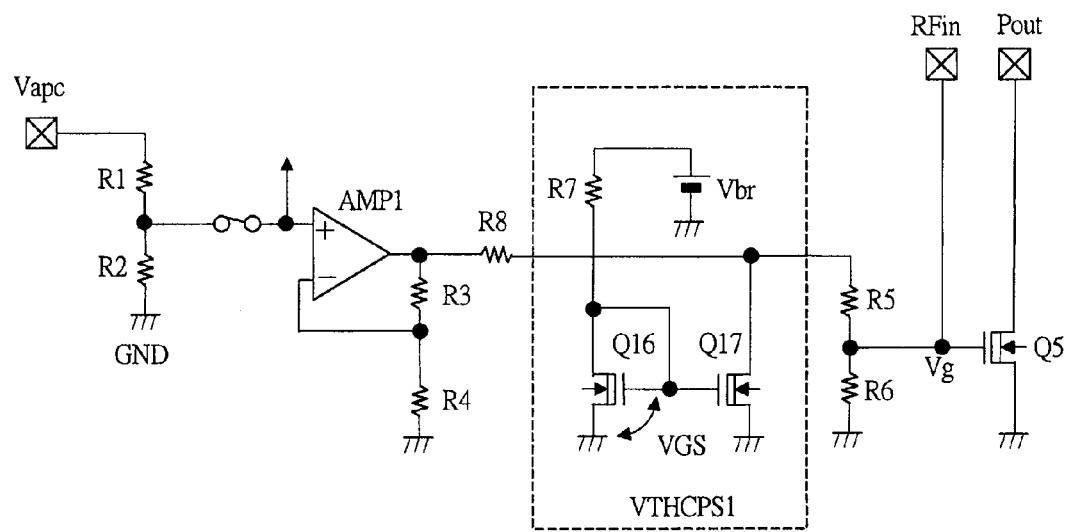
FIG. 1 is a circuit diagram showing a configuration example of a principal part in an electronic component for high frequency power amplification, according to a first embodiment of the present invention.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Preferred embodiments of the present invention will hereinafter be described in detail based on the accompanying drawings. The same reference numerals are respectively attached to the same components or members in all the drawings for describing the embodiments in principle, and their repetitive explanations will be omitted.

First Embodiment

FIG. 1 is a circuit diagram showing a configuration example of a principal part in an electronic component for high frequency power amplification, according to a first embodiment of the present invention. The electronic component shown in FIG. 1 comprises an amplifying NMOS transistor Q5 corresponding to one stage, an amplifier AMP1 for controlling a bias voltage of the NMOS transistor Q5, based on a bias control voltage Vapc, and resistors R1 through R6 and R8 and additionally has a threshold voltage compensator VTHCPS1.

The bias control voltage Vapc is divided by the resistors R1 and R2 coupled in series sequentially toward a ground power supply voltage GND. The so-divided voltage is applied to a (+) input of the amplifier AMP1. An output of the amplifier AMP1 is divided by the resistors R3 and R4 coupled in series sequentially toward GND. The so-divided voltage is fed back to a (−) input of the amplifier AMP1. The output of the amplifier AMP1 is divided by the resistors R8, R5 and R6 coupled in series sequentially toward GND. A bias voltage Vg from a coupling node of the resistors R5 and R6 is applied to a gate of the NMOS transistor Q5. A high frequency input signal RFin is inputted to the gate of the NMOS transistor Q5, and a high frequency output signal Pout corresponding to its amplified signal is outputted from a drain of the NMOS transistor Q5.

The threshold voltage compensator VTHCPS1 comprises NMOS transistors Q16 and Q17, a resistor R7 and a constant voltage circuit Vbr (1.2V, for example). The NMOS transistors Q16 and Q17 configure a current mirror circuit by coupling their gates in common, coupling their sources to GND and coupling the gate and drain of the NMOS transistor Q16 in common. The resistor R7 has one end coupled to the drain of the NMOS transistor Q16 and the other end coupled to the constant voltage circuit Vbr. Here, the NMOS transistor Q16 becomes a transistor formed in the same process specification (regardless of transistor size) as the NMOS transistor Q5. Although not limited in particular, the NMOS transistors Q16 and Q5 are of, for example, LDMOS (Laterally Diffused MOS) transistors. The constant voltage circuit Vbr is a circuit hard to cause voltage variations with variations in temperature, variations in manufacture, etc. Typical circuits include a bandgap type circuit, etc.

When such a configuration is used, the threshold voltage of the NMOS transistor Q16 is also reduced by ΔVth where the threshold voltage Vth of the NMOS transistor Q5 is reduced by ΔVth due to variations in manufacture, for example. This increases the current that flows between the source and drain of the NMOS transistor Q16, which in turn is transferred to the NMOS transistor Q17, thus increasing the current flowing through the resistor R8. As a result, the voltage of a coupling node of the resistors R8 and R5 is reduced and the bias voltage Vg is also lowered. It is therefore possible to compensate for ΔVth of the NMOS transistor Q5. Even when the threshold voltage Vth of the NMOS transistor Q5 is raised by ΔVth, it is possible to compensate for ΔVth by its reverse operation.

More specifically, assuming that the gate-to-source voltage of the NMOS transistor Q16 is set to VGS and R2/R1 is set equal to R4/R3, the bias voltage Vg is given by the following equation (1):

$$Vg = \left[ \frac{R2}{(R1+R2)} \times \frac{(R3+R4)}{R4} \times Vapc - \frac{R8}{R7} \times (Vbr - VGS) \right] \times \quad (1)$$
$$\frac{R6}{(R5+R6+R8)}$$
$$= \frac{R6}{(R5+R6+R8)} \times Vapc - \frac{R6 \times R8}{R7 \times (R5+R6+R8)} \times Vbr +$$
$$\frac{R6 \times R8}{R7 \times (R5+R6+R8)} \times VGS$$

$$\left[ \frac{R2}{R1} = \frac{R4}{R3} \right]$$

It is understood from the equation (1) that the gate-to-source voltage VGS varies with variations in the threshold voltages of the NMOS transistors Q5 and Q16 and a compensation voltage is added to the bias voltage Vg. Here, it is desirable that the values of the resistors R5 through R8 are set in such a manner that the third term of the equation (1) assumes such a condition as expressed in the following equation (2) in order to reflect the absolute value components of such variations highly accurately.

$$\frac{R6 \times R8}{R7 \times (R5+R6+R8)} = 1 \quad (2)$$

The third term of the equation (1) assumes a term for multiplying the gate-to-source voltage VGS by fractions including the resistors R5 through R8. Thus, assuming that the resistors R5 through R8 respectively vary by ΔR (%) with the variations in their manufacture (for example, R5 is brought to R5·(1+ΔR)), (1+ΔR)² occurs in the numerator and denominator of the fraction of the third term, so that the fraction thereof is cancelled out. Therefore, the influence of the variations in the manufacture of the resistors can also be reduced. On the other hand, when, for example, the configuration example of the patent document 1 is used, the variation ΔR (%) in resistance influences a variation in compensation voltage as it is.

Using the voltage control type configuration for applying the bias voltage to the gate of the amplifying transistor via the resistance division and additionally providing the threshold voltage compensator VTHCPS1 as shown in FIG. 1 as above make it possible to reduce a variation in the precharge level with the manufacturing variations in the threshold voltage Vth of the amplifying transistor. That is, a power control slope can be made small and variations in Vth can be reduced referring to FIG. 14B described above, thereby making it possible to narrow the width of Ppre_H through Ppre_L. It is thus possible to realize an improvement in switching spectrum characteristics. Since the threshold voltage compensator VTHCPS1 detects variations in the threshold voltage and allows a steady current (quiescent current) based on it to flow into the coupling node of R8 and R5 in parallel, it neither exerts an adverse effect such as noise on the normal operation of amplifying a high frequency signal nor causes a delay in response time of gain control. The response time is in danger of being delayed assuming that the compensator is inserted in series within a signal path at the execution of the gain control.

Figure 2:
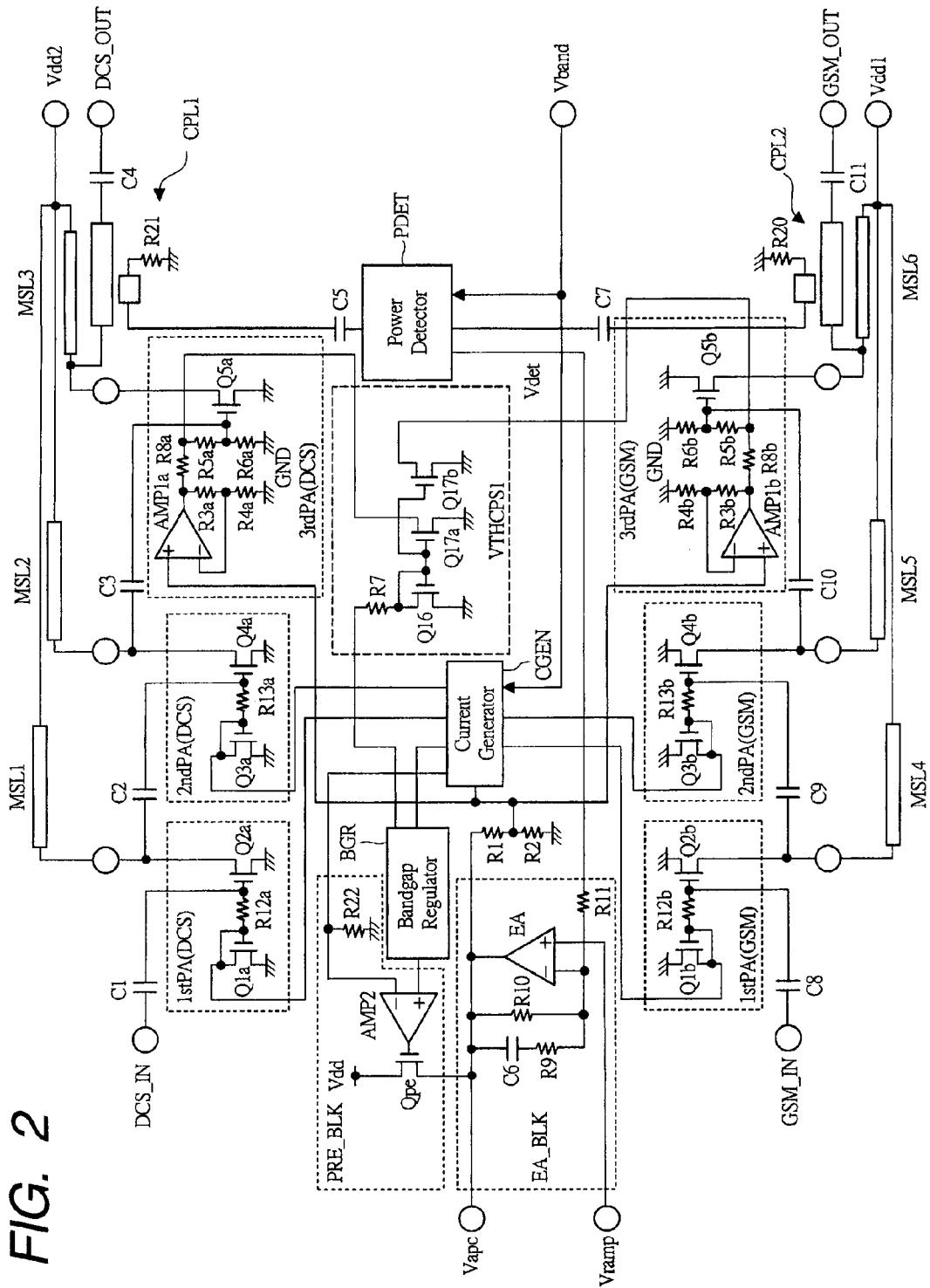
FIG. 2 is a circuit diagram illustrating an overall configuration example to which the configuration example of FIG. 1 is applied, of the electronic component according to the first embodiment of the present invention.

FIG. 2 is a circuit diagram showing an overall configuration example with the configuration example of FIG. 1 applied thereto, of the electronic component for the high frequency power amplification according to the first embodiment of the present invention. The electronic component shown in FIG. 2 serves as a multiband-compatible electronic component which comprises a first power amplifier section for amplifying a high frequency input signal DCS_IN of a DCS (Digital Cellular System) using a 1.8 GHz band and generating a high frequency output signal DCS_OUT, and a second power amplifier section for amplifying a high frequency input signal GSM_IN of a GSM using a 900 MHz band and generating a high frequency output signal GSM_OUT. The electronic component further has an automatic power control circuit section (APC circuit section) for loop-controlling the gain of the first power amplifier section or the second power amplifier section in response to an output level indication signal Vramp.

The high frequency input signal (high frequency input terminal) DCS_IN is coupled to a high frequency output signal (high frequency output terminal) DCS_OUT via amplifier units 1stPA (DCS) through 3rdPA (DCS) configured in three stages, which are coupled in tandem sequentially. The amplifier units 1stPA (DCS) and 2ndPA (DCS) perform gain control according to a current control type configuration including a current mirror circuit, and the amplifier unit 3rdPA (DCS) performs gain control according to a voltage control type configuration including the compensation for the threshold voltage such as shown in FIG. 1. The amplifier unit 1stPA (DCS) comprises an amplifying NMOS transistor Q2a and a bias NMOS transistor Q1a whose gate is coupled to a gate of the NMOS transistor Q2a via a resistor R12a and whose gate and drain are coupled in common. The NMOS transistor Q1a is supplied with a predetermined current from a current generator CGEN and a bias current of the NMOS transistor Q2a is set depending on the predetermined current. The high frequency input signal DCS_IN is inputted to the gate of the NMOS transistor Q2a via a DC cut capacitor C1. The NMOS transistor Q2a performs an amplifying operation with a transmission line MSL1 as a load and produces an output from its drain. The resistor R12a is provided to attenuate a high frequency signal directed to the gate of the NMOS transistor Q1a.

The amplifier unit 2ndPA (DCS) comprises an amplifying NMOS transistor Q4a and a bias NMOS transistor Q3a whose gate is coupled to a gate of the NMOS transistor Q4a via a resistor R13a and whose gate and drain are coupled in common. The NMOS transistor Q3a is supplied with a predetermined current from the current generator CGEN and a bias current of the NMOS transistor Q4a is set depending on the predetermined current. A signal outputted from the amplifier unit 1stPA (DCS) is inputted to the gate of the NMOS transistor Q4a via a DC cut capacitor C2. The NMOS transistor Q4a performs an amplifying operation with a transmission line MSL2 as a load and produces an output from its drain. The resistor R13a is provided to attenuate a high frequency signal directed to the gate of the NMOS transistor Q3a.

In a manner similar to FIG. 1, the amplifier unit 3rdPA (DCS) comprises an amplifying NMOS transistor Q5a, an amplifier AMP1a and resistors R3a through R6a and R8a. A threshold voltage compensator VTHCPS1 is coupled to a coupling node of the resistors R5a and R8a. Similarly to FIG. 1, a voltage obtained by dividing the bias control voltage Vapc by the resistors R1 and R2 is applied to a (+) input of the amplifier AMP1a. A signal outputted from the amplifier unit 2ndPA (DCS) is inputted to a gate of the NMOS transistor Q5a via a DC cut capacitor C3. The NMOS transistor Q5a performs an amplifying operation with a transmission line MSL3 as a load and produces an output from its drain. The drain output of the NMOS transistor Q5a is coupled to the high frequency output terminal DCS_OUT via a main line of a coupler CPL1 configured by the main line, a subline and a resistor R21 coupled to one end of the subline, and a DC cut capacitor C4.

Power corresponding to output power of the drain of the NMOS transistor Q5a is induced in the subline of the coupler CPL1. The power is inputted to a power detector PDET via a DC cut capacitor C5. The power detector PDET generates a detection voltage signal Vdet corresponding to the magnitude of the input power and outputs it to an error amplifier block EA_BLK. The error amplifier block EA_BLK compares an output level indication signal Vramp from a baseband circuit (not shown) and the detection voltage signal Vdet and generates a bias control voltage Vapc depending on the result of comparison. The current generator CGEN is inputted with the voltage obtained by dividing the bias control voltage Vapc by the resistors R1 and R2. Thus, the current generator CGEN generates a current corresponding to the magnitude of the bias control voltage Vapc and supplies it to the NMOS transistor Q1a of the amplifier unit 1stPA (DCS) and the NMOS transistor Q3a of the amplifier unit 2ndPA (DCS).

Figure 13:
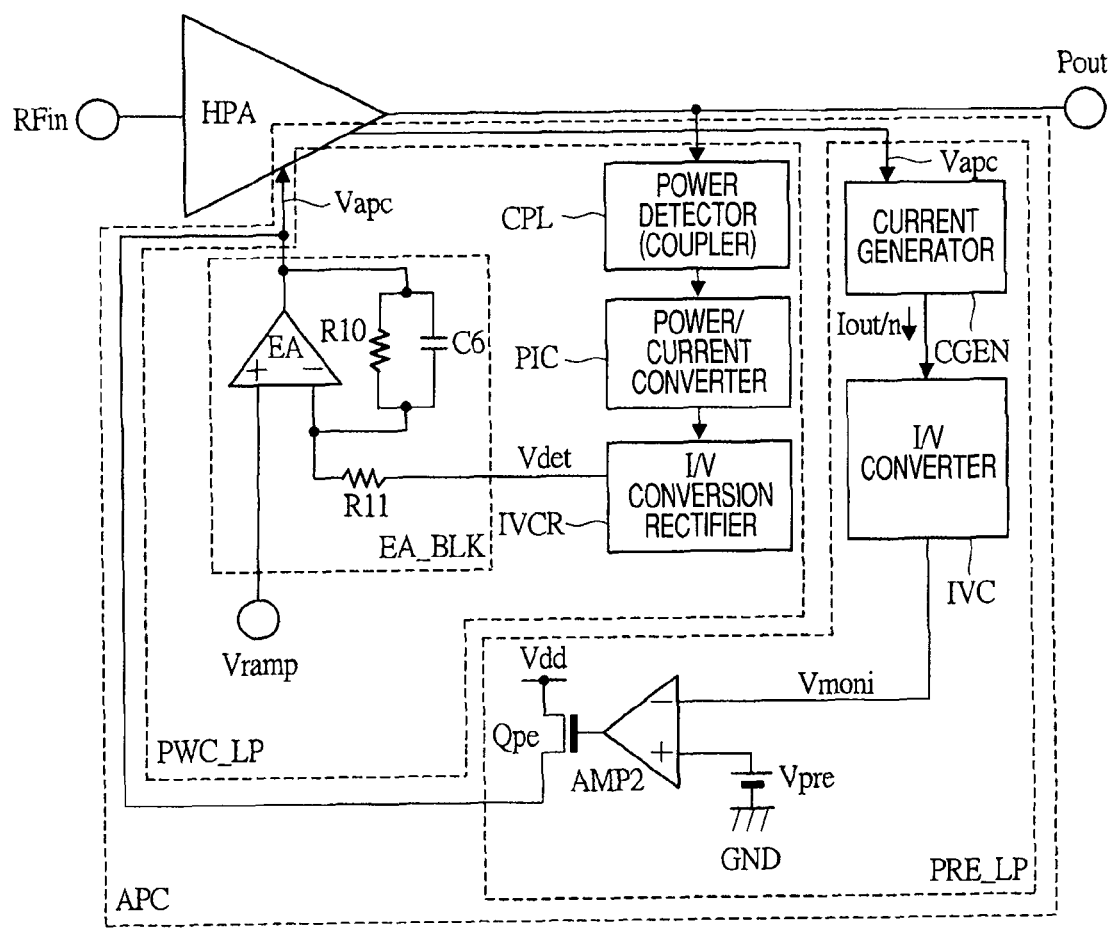
FIG. 13 is a block diagram depicting a schematic configuration example of an electronic component for high frequency power amplification, which has been examined as a premise of the present invention.

The current generator CGEN further generates a current corresponding to the magnitude of the bias control voltage Vapc and outputs it even to a precharge lock PRE_BLK. The precharge block PRE_BLK converts the current supplied from the current generator CGEN to a voltage by a resistor R22 and compares the voltage and a reference voltage outputted from a bandgap regulator BGR by an amplifier AMP2. The amplifier AMP2 drives a precharge transistor Qpe according to the result of comparison and controls the bias control voltage Vapc via the precharge transistor Qpe. Incidentally, the current generator CGEN and the precharge block PRE_BLK configure the above precharge loop PRE_LP shown in FIG. 13. The coupler CPL1, the power detector PDET and the error amplifier block EA_BLK configure the power control loop PWC_LP shown in FIG. 13. The more-detailed configured examples of the PRE_LP and PWC_LP have been described in, for example, the above patent document 2.

The high frequency input signal (high frequency input terminal) GSM_IN is coupled to a high frequency output signal (high frequency output terminal) GSM_OUT via amplifier units 1stPA (GSM) through 3rdPA (GSM) configured in three stages, which are coupled in tandem sequentially. The amplifier units 1stPA (GSM) and 2ndPA (GSM) perform gain control according to the current control type configuration including a current mirror circuit, and the amplifier unit 3rdPA (GSM) performs gain control according to the voltage control type configuration including the compensation for the threshold voltage such as shown in FIG. 1. Since the details of these circuits are similar to the above respective circuits for the DCS, their detailed explanations will be omitted. A portion for switching between the DCS and the GSM will be explained below while paying attention to it.

The power control loop PWC_LP and the precharge loop PRE_LP are used in common to the DCS and the GSM. Here, the power detector PDET and the current generator CGEN can perform switching of their own operations according to a band selection signal Vband outputted from the baseband circuit (not shown) upon selection of either the DCS or the GSM. When the DCS is selected, the power detector PDET detects power inputted from the coupler CPL1, whereas when the GSM is selected, the power detector PDET detects power inputted from a coupler CPL2 coupled to the output of the amplifier unit 3rdPA (GSM). The current generator CGEN selects either the supply of current to the amplifier units 1stPA (DCS) and 2ndPA (DCS) or the supply of current to the amplifier units 1stPA (GSM) and 2ndPA (GSM) depending on either the DCS or the GSM.

In the threshold voltage compensator VTHCPS1, two current transfer NMOS transistors Q17a and Q17b are coupled to the gate of the threshold voltage monitoring NMOS transistor Q16 in FIG. 1. A variation in the threshold voltage of the amplifying NMOS transistor Q5a lying within the amplifier unit 3rdPA (DCS) is compensated by a drain current of the NMOS transistor Q17a. A variation in threshold voltage of an amplifying NMOS transistor Q5b lying within the amplifier unit 3rdPA (GSM) is compensated by a drain current of the NMOS transistor Q17b. In this case, the NMOS transistor Q5a lying in the amplifier unit 3rdPA (DCS) and the NMOS transistor Q5b lying in the amplifier unit 3rdPA (GSM) are formed in the same process specification as the NMOS transistor Q16. The NMOS transistor Q16 detects the variations in the threshold voltages of the NMOS transistors Q5a and Q5b in common.

As shown in FIG. 2 as above, the current control type configuration is used for the amplifying stages (1stPA and 2ndPA herein) other than the final stage, the voltage control type configuration is used for the final stage (3rdPA herein), and the compensation for their threshold voltages is performed, thereby making it possible to generate stable output power from a low power region to a high power region inclusive of a precharge level.

Figure 14A:
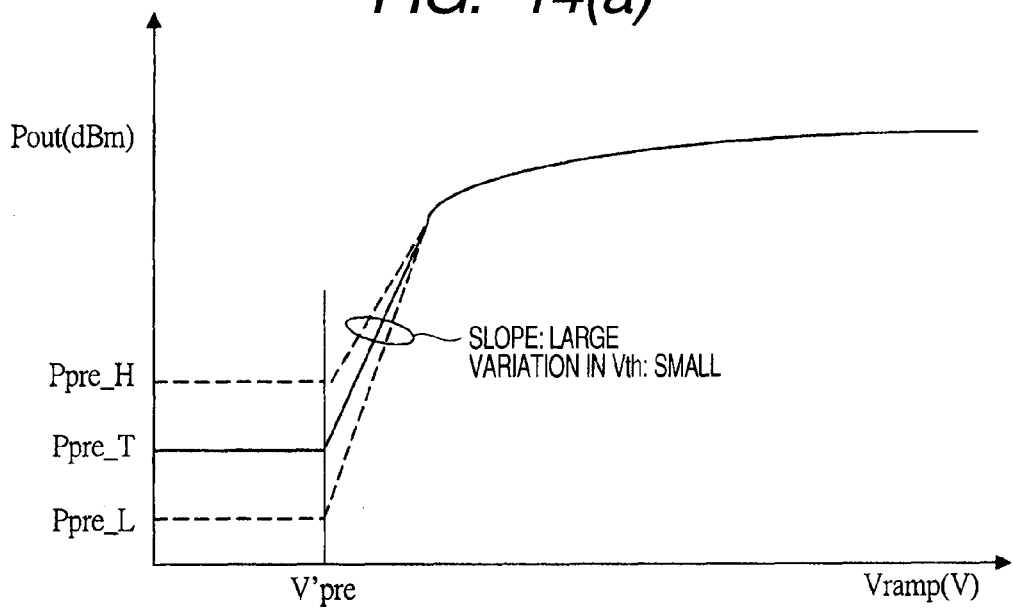
Figure 14B:
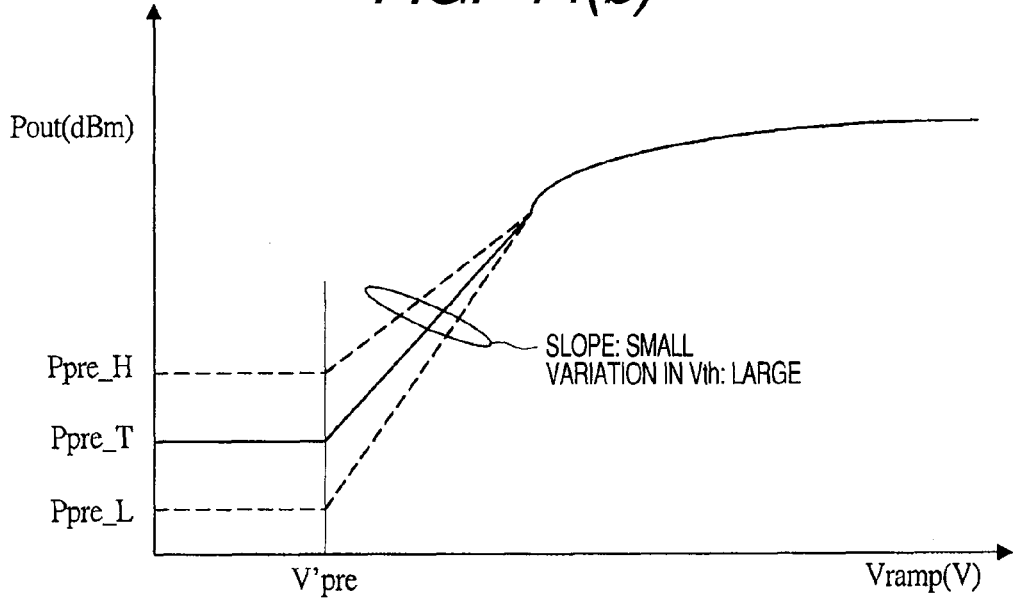

Namely, as long as the loop control (power control loop PWC_LP shown in FIG. 13) by the APC circuit functions, the current control type configuration is superior to the voltage control type configuration in power stability (accuracy or the like relative to output level indication signal Vramp). Thus, it is desirable that the current control type configuration is originally used in all stages. In doing so, however, as shown in FIG. 14A, the magnitude of the power control slope of the current control type influences a region (i.e., region in which the detection of power by the coupler is hard) in which the loop control by the APC circuit does not function, as in the precharge level, so that the stable precharge level is not obtained. Thus, the voltage control type configuration is applied to the final stage to reduce the power control slope, and the influence of variations in the threshold voltage indicative of a demerit of the voltage control type is compensated, thereby making it possible to achieve the stabilization of the precharge level.

While the stabilization of the precharge level can however be ensured where the voltage control type configuration is used, there is a fear of a possibility that power stability will be degraded as a demerit. This point is not much of a problem because the voltage control type configuration is used in the final stage alone. That is, normally, the first and second stages principally influence power stability in low and middle power regions, and the third stage principally influences power stability in a high power region. Particularly in the high power region of these power regions, the power stability becomes almost trivial because the loop control by the APC circuit functions sufficiently. Accordingly, the power stability is eventually obtained from the low to high power regions by applying the voltage control type configuration to only the final stage that influences the high power region. Further, the stability of the precharge level can also be obtained by compensation for the variations in the threshold voltage.

Figure 3A:
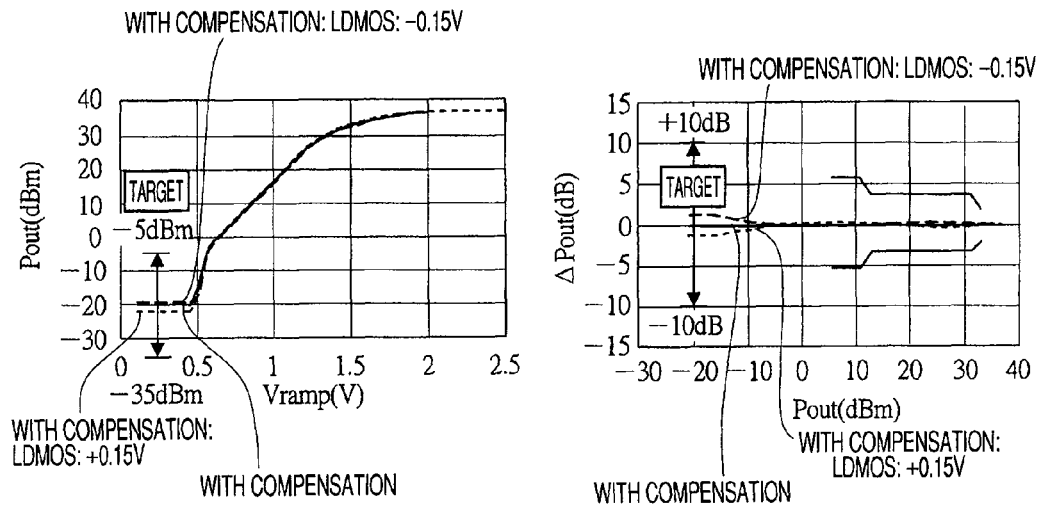
FIG. 3A shows one example of characteristics of the electronic component shown in FIG. 2.
Figure 3B:
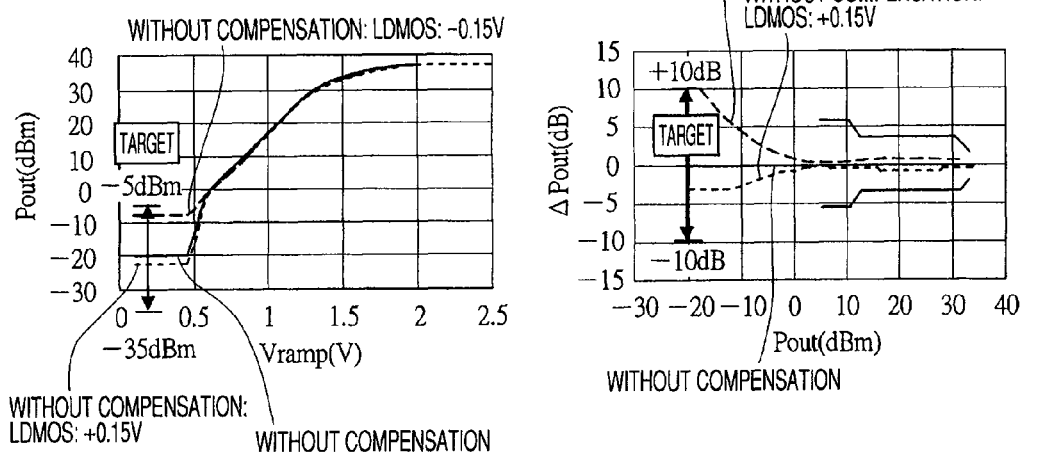
FIG. 3B shows one example of characteristics thereof where a threshold voltage compensator is omitted from FIG. 2, as a target for its comparison.

FIG. 3A shows one example of characteristics of the electronic component shown in FIG. 2, and FIG. 3B shows one example of characteristics thereof where the threshold voltage compensator VTHCPS1 is omitted from FIG. 2, as a target for its comparison. In FIGS. 3A and 3B, the characteristic of output power Pout relative to an output level indication signal Vramp is shown on the left side, and a power variation (i.e., how much the output power varies with respect to environmental variations (power supply voltage, input power, temperature and frequency) relative to output power Pout is shown on the right side. Here, the result of verification using the GSM circuit section in FIG. 2 is shown.

It is understood that as shown in FIG. 3A, a stable precharge level can be generated regardless of a variation (±0.15V here) in threshold voltage. Here, a target range of precharge level is set to a range of −35 dBm to −5 dBm. A margin can be ensured sufficiently for this target range. Further, it is understood that as shown in FIG. 3A, a satisfactory power variation characteristic can also be obtained regardless of a variation (±0.15V here) in threshold voltage by using the configuration example of FIG. 2. A range allowable for the power variation is defined in the GSM standard or the like, for example. A margin can be ensured sufficiently with respect to the target range on which the allowable range is reflected. On the other hand, as shown in FIG. 3B, when the threshold voltage compensator VTHCPS1 is omitted, a precharge level and a power variation vary greatly together and a margin does not meet a target range or is greatly reduced with respect to the target range.

Figure 4:
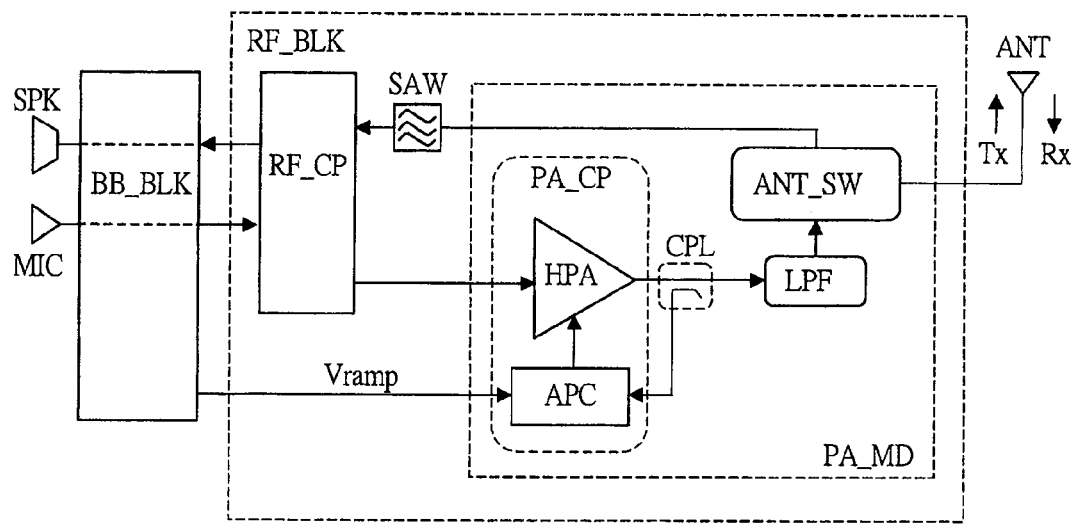
FIG. 4 is a block diagram showing an overall configuration example of a wireless communication system including the electronic component according to the first embodiment of the present invention.

FIG. 4 is a block diagram showing an overall configuration example of a wireless communication system including the electronic component according to the first embodiment of the present invention. The wireless communication system shown in FIG. 4 is of, for example, a cellular phone and comprises a baseband processor BB_BLK, a high frequency processor RF_BLK, an antenna ANT, a speaker SPK and a microphone MIC, etc. An electronic component called "RF power amplifier module PA_MD" is included in the high frequency processor RF_BLK. The electronic component according to the present embodiment is applied to it.

The RF power amplifier module PA_MD comprises, for example, a power amplifier chip PA_CP, a coupler CPL, a low pass filter LPF and an antenna switch ANT_SW, etc. mounted over one wiring board. The power amplifier chip PA_CP is implemented by one semiconductor chip and formed with the multiband-adaptable high power amplifier HPA and automatic power controller APC such as shown in FIG. 2, for example. The coupler CPL corresponds to the couplers CPL1 and CPL2 in FIG. 2 and is formed using a transmission line lying over the wiring board along with an LPF, for example. The antenna switch ANT_SW is realized by one semiconductor chip, for example.

In FIG. 4, a reception signal Rx received by the antenna ANT is separated by the antenna switch ANT_SW every frequency band and thereafter inputted to a high frequency signal processing chip RF_CP via SAW (Surface Acoustic Wave) filter. The high frequency signal processing chip RF_CP amplifies the input signal using a low noise amplifier (LNA) and outputs a signal subjected to downconversion and demodulation using a mixer or the like to the baseband processor BB_BLK. The baseband processor BB_BLK processes this signal and outputs voice via the speaker SPK, for example.

On the other hand, a voice signal inputted from the microphone MIC is outputted to the high frequency signal processing chip RF_CP through its signal processing by the baseband processor BB_BLK. The high frequency signal processing chip RF_CP performs upconversion and modulation on the signal using the mixer or the like and outputs the same to the power amplifier chip PA_CP. The power amplifier chip PA_CP performs power amplification necessary for transmission. At this time, the automatic power controller APC RF-detects a transmit signal of the power amplifier chip PA_CP detected by the coupler CPL or the like. Thereafter, the power amplifier chip PA_CP compares the transmit signal and an output level indication signal Vramp generated at the baseband processor BB_BLK in accordance with base station information and reflects a signal of an error between the two signals on the high power amplifier HPA to perform power control. After unnecessary harmonic components have been eliminated from the signal having reached a predetermined level by the low pass filter LPF, the so-processed signal is transmitted to the antenna ANT via the antenna switch ANT_SW and sent as a transmit signal Tx.

Using the electronic component according to the first embodiment as above makes it possible to typically stabilize the precharge level and implement an improvement in switching spectrum characteristics. Incidentally, although the configuration example comprised of the plural stages of amplifier units with the three-stage configuration as the example has been shown in FIG. 2, the present invention is not necessarily limited to the plural stages. In some cases, it can be applied even to a voltage control type amplifier unit of a one-stage configuration. Since, however, the power range is limited in the case of the one-stage configuration, it is desirable that the plural stages are used actually. When the plural stages are used, the configuration is not necessarily limited to the three-stage configuration, but may be greater than or not greater than the three stages. In this case, however, it is desirable that as understood from the description of FIG. 2, at least, the current control type is applied to at least the first stage, the voltage control type is applied to the final stage and the threshold voltage compensator is added. Although the multiband adaptable configuration example comprised of the GSM and DCS is shown in FIG. 2, a single-band adaptable configuration, a triple-band adaptable configuration or the like may of course be adopted. The communication system is not limited to the GSM and DCS, but may be a W-CDMA (Wideband Code Division Multiple Access) system or the like, for example.

Second Embodiment

Figure 5:
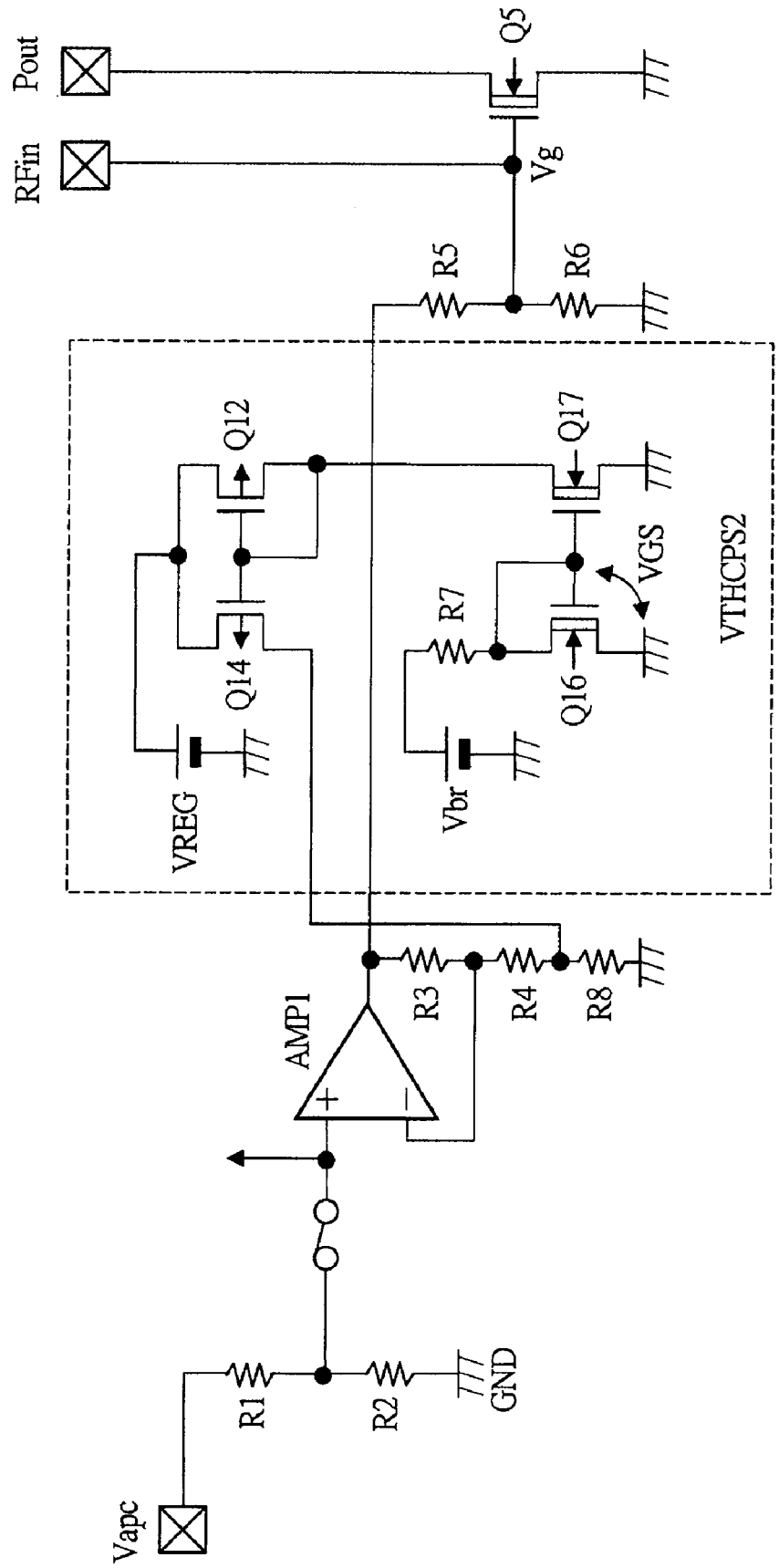
FIG. 5 is a circuit diagram illustrating a configuration example of a principal part in an electronic component for high frequency power amplification, according to a second embodiment of the present invention.

A second embodiment will explain a modification of the threshold voltage compensator shown in the first embodiment. FIG. 5 is a circuit diagram illustrating a configuration example of a principal part in an electronic component for high frequency power amplification, according to the second embodiment of the present invention. The electronic component shown in FIG. 5 comprises an amplifying NMOS transistor Q5 corresponding to one stage, an amplifier AMP1 for controlling a bias voltage of the NMOS transistor Q5, based on a bias control voltage Vapc, and resistors R1 through R6 an R8 and additionally includes a threshold voltage compensator VTHCPS2.

The bias control voltage Vapc is divided by the resistors R1 and R2 coupled in series sequentially toward a ground power supply voltage GND. The so-divided voltage is applied to a (+) input of the amplifier AMP1. An output of the amplifier AMP1 is divided by the resistors R3, R4 and R8 coupled in series sequentially toward GND. A coupling node of the resistors R3 and R4 is fed back to a (−) input of the amplifier AMP1. The output of the amplifier AMP1 is divided by the resistors R5 and R6 coupled in series sequentially toward GND. A bias voltage Vg from a coupling node of the resistors R5 and R6 is applied to a gate of the NMOS transistor Q5. A high frequency input signal RFin is inputted to the gate of the NMOS transistor Q5 and a high frequency output signal Pout corresponding to its amplified signal is outputted from a drain of the NMOS transistor Q5.

The threshold voltage compensator VTHCPS2 comprises NMOS transistors Q16 and Q17, PMOS transistors Q12 and Q14, a resistor R7 and constant voltage circuits Vbr and VREG. The NMOS transistors Q16 and Q17 configure a current mirror circuit by coupling their gates in common, coupling their sources to GND and coupling the gate and drain of the NMOS transistor Q16 in common. The resistor R7 has one end coupled to the drain of the NMOS transistor Q16 and the other end coupled to the constant voltage circuit Vbr. The PMOS transistors Q12 and Q14 configure a current mirror circuit by coupling their gates in common, coupling their sources to the constant voltage circuit VREG and coupling the gate and drain of the PMOS transistor Q12 in common. The drain of the PMOS transistor Q12 is coupled to a drain of the NMOS transistor Q17. A drain of the PMOS transistor Q14 is coupled to a coupling node of the resistors R4 and R8.

Here, the NMOS transistor Q16 becomes a transistor formed in the same process specification (regardless of transistor size) as the NMOS transistor Q5. Although not limited in particular, the NMOS transistors Q16 and Q5 are of, for example, LDMOS transistors. The constant voltage circuits Vbr and VREG are circuits hard to cause voltage variations with variations in temperature, variations in manufacture, etc. Typical circuits include a bandgap circuit, a power regulator that performs voltage generation using it. Although not limited in particular, the voltages generated by the constant voltage circuits are given as Vbr<VREG here. There are provided, for example, Vbr=1.2V, VREG=2.75V, etc. Incidentally, the constant voltage circuit VREG may be, for example, a stabilized power supply or the like provided outside.

When such a configuration is used, the threshold voltage of the NMOS transistor Q16 is also reduced by ΔVth where the threshold voltage Vth of the NMOS transistor Q5 is reduced by ΔVth due to variations in manufacture, for example. This increases the current that flows between the source and drain of the NMOS transistor Q16, which in turn is transferred to the NMOS transistor Q17 and the PMOS transistors Q12 and Q14, thus increasing the current flowing through the resistor R8. Thus, since the voltage of the coupling node of the resistors R3 and R4 is fixed although the voltage of the coupling node of the resistors R8 and R4 rises, the current flowing through the resistor R4 decreases and the output voltage of the amplifier AMP1 is reduced. As a result, it is possible to compensate for ΔVth of the NMOS transistor Q5 because the bias voltage Vg is also reduced. Even when the threshold voltage Vth of the NMOS transistor Q5 is raised by ΔVth, it is possible to compensate for ΔVth by its reverse operation.

More specifically, when the gate-to-source voltage of the NMOS transistor Q16 is set as VGS and R2/R1 is set equal to (R4+R8)/R3, the bias voltage Vg is given by the following equation (3):

$$Vg = \left[ \begin{array}{c} \frac{R2}{(R1+R2)} \times \frac{(R3+R4+R8)}{R4+R8} \times \\ Vapc - \frac{R3 \times R8}{(R4+R8) \times R7} \times (Vbr - VGS) \end{array} \right] \times \frac{R6}{(R5+R6)} \quad (3)$$

$$= \frac{R6}{(R5+R6)} \times Vapc - \frac{R3 \times R8 \times R6}{(R4+R8) \times R7 \times (R5+R6)} \times Vbr + \frac{R3 \times R8 \times R6}{(R4+R8) \times R7 \times (R5+R6)} \times VGS$$

$$\left[ \frac{R2}{R1} = \frac{R4+R8}{R3} \right]$$

It is understood from the equation (3) that the gate-to-source voltage VGS varies with variations in the threshold voltages of the NMOS transistors Q5 and Q16, and a compensation voltage is added to Vg. Here, it is desirable that the values of the resistors R3 through R8 are set in such a manner that the third term of the equation (3) assumes such a condition as expressed in the following equation (4) in order to reflect the absolute values of such variations highly accurately.

$$\frac{R3 \times R8 \times R6}{(R4+R8) \times R7 \times (R5+R6)} = 1 \quad (4)$$

The third term of the equation (3) assumes a term for multiplying the gate-to-source voltage VGS by fractions including the resistors R3 through R8. Thus, assuming that the resistors R3 through R8 respectively vary by ΔR (%) with the variations in their manufacture (for example, R3 is brought to R3·(1+ΔR)), (1+ΔR)³ occurs in the numerator and denominator of the fraction of the third term, so that the fraction thereof is cancelled out. Therefore, the influence of the variations in the manufacture of the resistors can also be reduced. On the other hand, when, for example, the configuration example of the patent document 1 is used, the variation ΔR (%) in resistance influences a variation in compensation voltage as it is.

Using the voltage control type configuration for applying the bias voltage to the gate of each amplifying transistor via the resistance division and additionally providing the threshold voltage compensator VTHCPS2 as shown in FIG. 5 as above make it possible to reduce a variation in precharge level and realize an improvement in switching spectrum characteristics. In a manner similar to FIG. 1, adverse effects such as noise and a delay in response are not exerted on the normal high frequency amplifying operation. Further, although the threshold voltage compensator VTHCPS2 shown in FIG. 5 increases in the number of circuit's elements as compared with the threshold voltage compensator VTHCPS1 shown in FIG. 1, it is brought to a configuration less subject to a high frequency input signal RFin because its coupling destination corresponds to the coupling node of the resistors R4 and R8. It is thus possible to realize compensation for a stable threshold voltage in, for example, in middle and high power regions in which the amplitude of the high frequency input signal RFin becomes large. Incidentally, although the influence of the threshold voltage is reduced to some extent by control of the APC circuit in the middle and high power regions, this influence can be more reduced by using such a configuration example as shown in FIG. 5.

Figure 6:
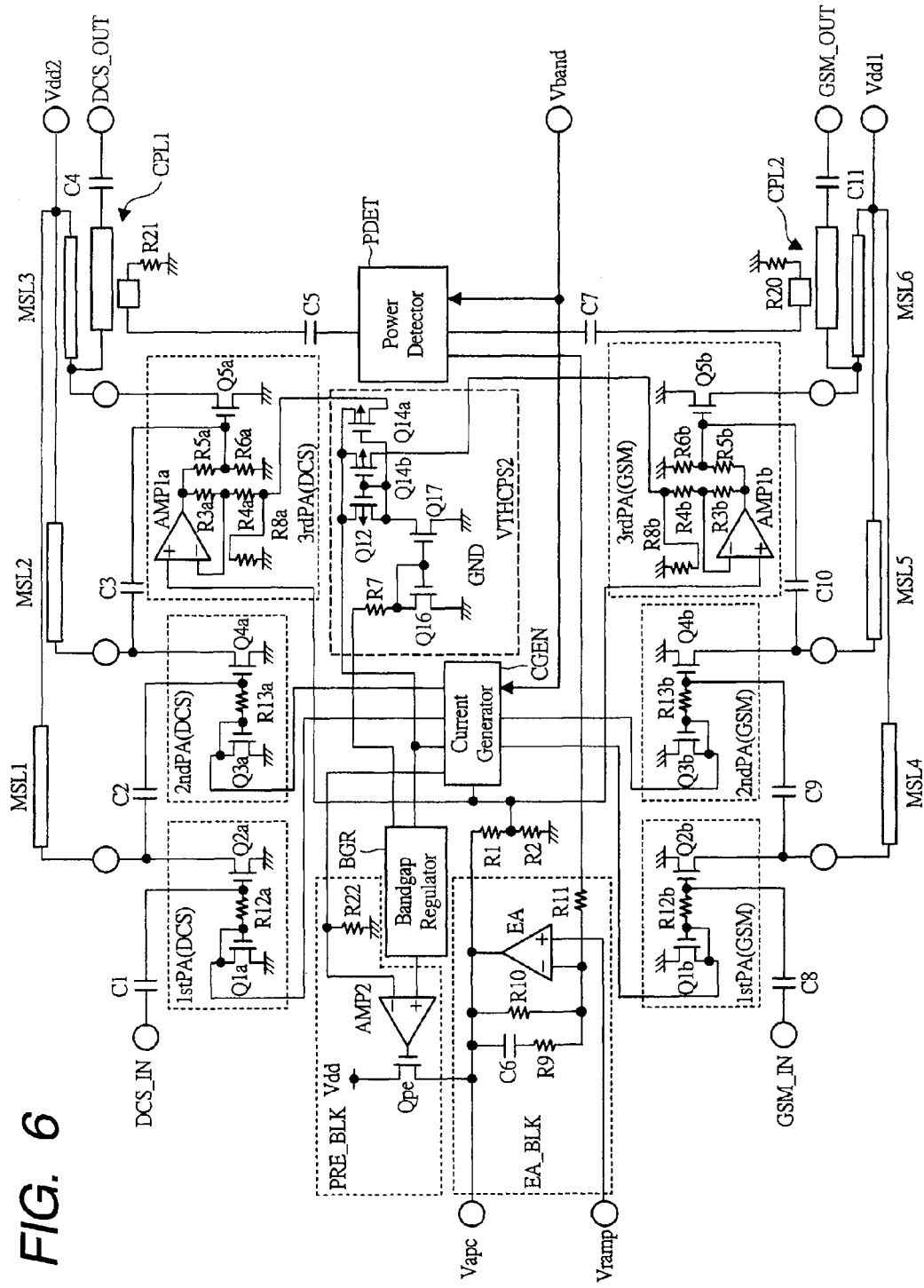
FIG. 6 is a circuit diagram showing an overall configuration example to which the configuration example of FIG. 5 is applied, of the electronic component according to the second embodiment of the present invention.

FIG. 6 is a circuit diagram showing an overall configuration example to which the configuration example of FIG. 5 is applied, of the electronic component according to the second embodiment of the present invention. In a manner similar to the configuration example of FIG. 2, the electronic component shown in FIG. 6 comprises a first power amplifier section for a DCS, a second power amplifier section for a GSM, and an automatic power control circuit section (APC circuit section) for loop-controlling the gain of the first power amplifier section or the second power amplifier section in response to an output level indication signal Vramp. The present configuration example shown in FIG. 6 is different from the configuration example of FIG. 2 in that the configuration example of FIG. 5 is applied to amplifier units 3rdPA (DCS) and 3rdPA (GSM) corresponding to third stages in the first and second power amplifier sections, and the threshold voltage compensator VTHCPS2 of FIG. 5 is applied with its application. Since configurations other than it are similar to those of FIG. 2, their detailed explanations will be omitted.

In a manner similar to FIG. 5, the amplifier unit 3rdPA (DCS) comprises an amplifying NMOS transistor Q5*a*, an amplifier AMP1*a* and resistors R3*a* through R6*a* and R8*a*. The threshold voltage compensator VTHCPS2 is coupled to a coupling node of the resistors R4*a* and R8*a*. Similarly to FIG. 5, a voltage obtained by dividing the bias control voltage Vapc by the resistors R1 and R2 is applied to a (+) input of the amplifier AMP1*a*. A signal outputted from the amplifier unit 2ndPA (DCS) is inputted to a gate of the NMOS transistor Q5*a* via a DC cut capacitor C3. The NMOS transistor Q5*a* performs an amplifying operation with a transmission line MSL3 as a load and produces an output from its drain. Incidentally, the amplifier unit 3rdPA (GSM) also has a configuration similar to the amplifier unit 3rdPA (DCS).

In the threshold voltage compensator VTHCPS2, two current transfer PMOS transistors Q14*a* and Q14*b* are coupled to the gate of the PMOS transistor Q12 shown in FIG. 5. A variation in the threshold voltage of the amplifying NMOS transistor Q5*a* lying within the amplifier unit 3rdPA (DCS) is compensated by a drain current of the PMOS transistor Q14*a*. A variation in the threshold voltage of an amplifying NMOS transistor Q5*b* lying within the amplifier unit 3rdPA (GSM) is compensated by a drain current of the PMOS transistor Q14*b*. Here, a power regulator for generating a predetermined voltage using a bandgap voltage is also assumed to be included in its corresponding bandgap circuit BGR. The constant voltage circuits Vbr and VREG in FIG. 5 are implemented by this BGR.

Using the electronic component according to the second embodiment as above makes it possible to obtain an advantageous effect similar to the first embodiment, typically to achieve the stabilization of each precharge level and realize an improvement in switching spectrum characteristics. As compared with the first embodiment, higher accurate compensation for the threshold voltage can be realized in the middle and high power regions, for example.

Third Embodiment

Figure 7:
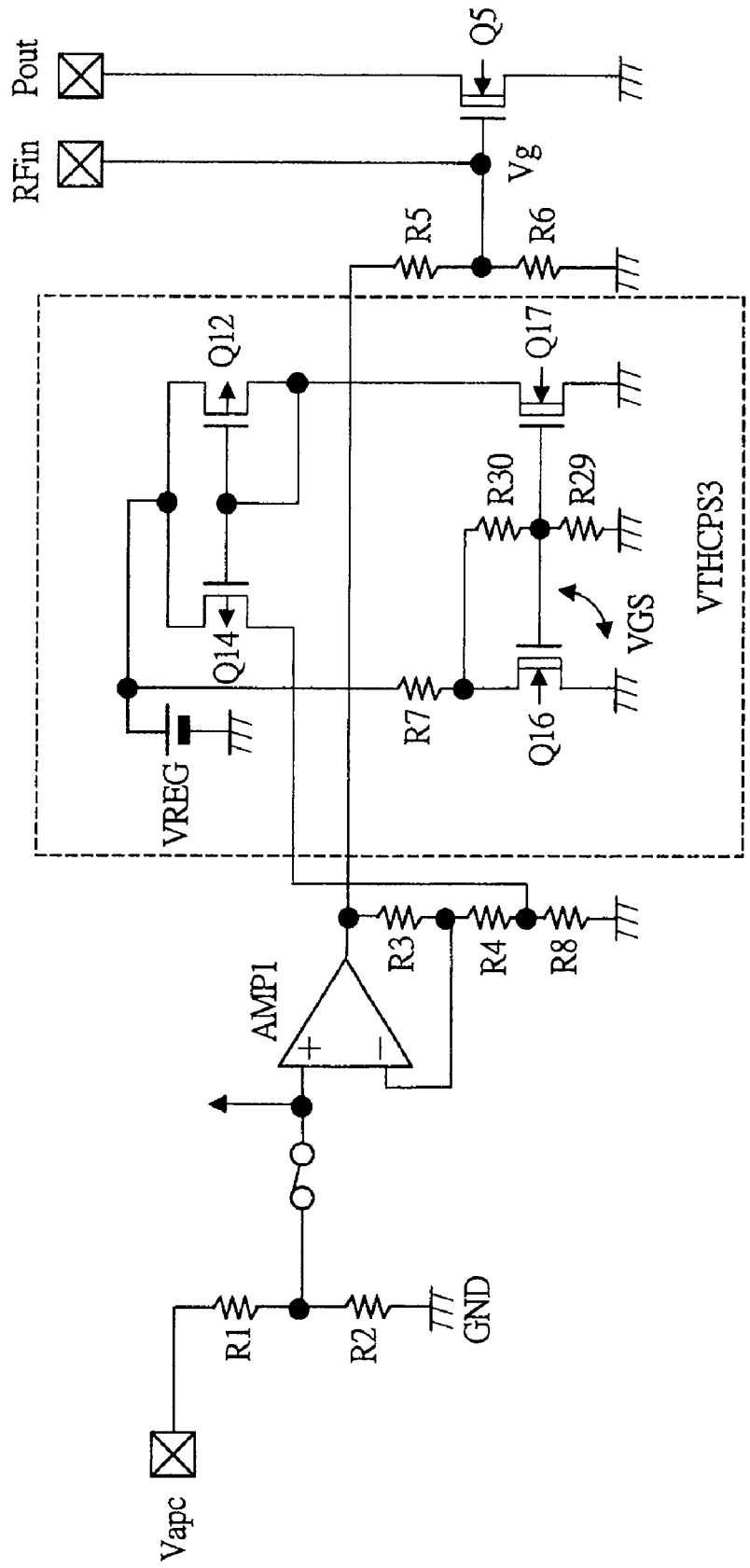
FIG. 7 is a circuit diagram illustrating a configuration example of a principal part in an electronic component for high frequency power amplification, according to a third embodiment of the present invention.

A third embodiment will explain a modification of the threshold voltage compensator shown in the second embodiment. FIG. 7 is a circuit diagram illustrating a configuration example of a principal part in an electronic component for high frequency power amplification, according to the third embodiment of the present invention. The electronic component shown in FIG. 7 comprises an amplifying NMOS transistor Q5 corresponding to one stage, an amplifier AMP1 for controlling a bias voltage of the NMOS transistor Q5, based on a bias control voltage Vapc, and resistors R1 through R6 and R8. In addition to the above, the electronic component is provided with a threshold voltage compensator VTHCPS3.

The bias control voltage Vapc is divided by the resistors R1 and R2 coupled in series sequentially toward a ground power supply voltage GND. The so-divided voltage is applied to a (+) input of the amplifier AMP1. An output of the amplifier AMP1 is divided by the resistors R3, R4 and R8 coupled in series sequentially toward GND. A coupling node of the resistors R3 and R4 is fed back to a (−) input of the amplifier AMP1. The output of the amplifier AMP1 is divided by the resistors R5 and R6 coupled in series sequentially toward GND. A bias voltage Vg from a coupling node of the resistors R5 and R6 is applied to a gate of the NMOS transistor Q5. A high frequency input signal RFin is inputted to the gate of the NMOS transistor Q5, and a high frequency output signal Pout corresponding to its amplified signal is outputted from a drain of the NMOS transistor Q5.

The threshold voltage compensator VTHCPS3 comprises NMOS transistors Q16 and Q17, PMOS transistors Q12 and Q14, resistors R7, R29 and R30 and a constant voltage circuit VREG (2.75V or the like, for example). The NMOS transistors Q16 and Q17 respectively have gates coupled in common and sources coupled to GND. A drain of the NMOS transistor Q16 is divided by the resistors R30 and R29 series-coupled sequentially toward GND. A coupling node of the resistors R30 and R29 is coupled to the gate of the NMOS transistor Q16. The resistor R7 has one end coupled to the drain of the NMOS transistor Q16 and the other end coupled to the constant voltage circuit VREG. The PMOS transistors Q12 and Q14 configure a current mirror circuit by coupling their gates in common, coupling their sources to the constant voltage circuit VREG and coupling the gate and drain of the PMOS transistor Q12 in common. The drain of the PMOS transistor Q12 is coupled to a drain of the NMOS transistor Q17. A drain of the PMOS transistor Q14 is coupled to a coupling node of the resistors R4 and R8.

Here, the NMOS transistor Q16 becomes a transistor formed in the same process specification (regardless of transistor size) as the NMOS transistor Q5. Although not limited in particular, the NMOS transistors Q16 and Q5 are of, for example, LDMOS transistors. The constant voltage circuit VREG is a circuit hard to cause voltage variations with variations in temperature, variations in manufacture, etc. Typical circuits include a bandgap circuit and a power regulator that performs voltage generation using it. The constant voltage circuit VREG may be, for example, a stabilized power supply or the like provided outside.

As compared with the configuration example of FIG. 5, the configuration example of FIG. 7 differs therefrom in that the other end of the resistor R7 is coupled to the constant voltage circuit VREG, and the resistors R29 and R30 are provided.

Thus, the circuit configuration is rendered simpler by configuring the constant voltage circuit by one power supply (VREG). Further, the provision of the resistors R29 and R30 makes it possible to assign weights to the components of variation in the threshold voltage in a wide range and thereby compensate therefor. That is, assuming that the gate-to-source voltage of the NMOS transistor Q16 is set as VGS and R2/R1 is set equal to (R4+R8)/R3, the bias voltage Vg is given by the following equation (5):

$$Vg = \left[ \frac{\frac{R2}{(R1+R2)} \times \frac{(R3+R4+R8)}{R4+R8} \times}{Vapc - \frac{R3 \times R8}{(R4+R8) \times R7} \times \left(VREG - \frac{R29+R30}{R29}VGS\right)} \right] \times \frac{R6}{(R5+R6)}$$

$$= \frac{R6}{(R5+R6)} \times Vapc - \frac{R3 \times R8 \times R6}{(R4+R8) \times (R5+R6) \times R7} \times VREG + \frac{R3 \times R8 \times R6 \times (R29+R30)}{(R4+R8) \times (R5+R6) \times R7 \times R29} \times VGS$$

$$\left[ \frac{R2}{R1} = \frac{R4+R8}{R3} \right]$$

It is understood from the equation (5) that the gate-to-source voltage VGS varies with variations in the threshold voltages of the NMOS transistors Q5 and Q16, and a compensation voltage is added to Vg. Here, it is desirable that the values of the resistors R3 through R8, R29 and R30 are set in such a manner that the third term of the equation (5) assumes such a condition as expressed in the following equation (6) in order to reflect the absolute values of such variations highly accurately.

$$\frac{R3 \times R8 \times R6 \times (R29+R30)}{(R4+R8) \times (R5+R6) \times R7 \times R29} = 1 \quad (6)$$

Namely, in the case of the configuration example of FIG. 5, the range allowable for the left side of the equation (4) is actually limited to some extent. It is not always possible to obtain a solution that meets the equation (4). To this end, the resistors R29 and R30 are additionally provided. Thus, since the range allowable for the left side of the equation (6) spreads, it becomes easy to obtain a solution (or more approximate solution) that satisfies the equation (6) and hence higher accurate compensation for the threshold voltage can be realized.

The third term of the equation (5) assumes a term for multiplying VGS by fractions including the resistors R3 through R8, R29 and R30. Thus, assuming that the resistors R3 through R8, R29 and R30 respectively vary by ΔR (%) with the variations in their manufacture (for example, R3 is brought to R3·(1+ΔR)), $(1+\Delta R)^4$ occurs in the numerator and denominator of the fraction of the third term, so that the fraction thereof is cancelled out. Therefore, the influence of the variations in the manufacture of the resistors can also be reduced. On the other hand, when, for example, the configuration example of the patent document 1 is used, the variation ΔR (%) in resistance influences variations in compensation voltage as it is.

Using the voltage control type configuration for applying the bias voltage to the gate of each amplifying transistor via the resistance division and additionally providing the threshold voltage compensator VTHCPS3 as shown in FIG. 7 as above make it possible to reduce a variation in precharge level and realize an improvement in switching spectrum characteristics in a manner similar to the case of FIG. 1. In a manner similar to FIG. 1, adverse effects such as noise and a delay in response are not exerted on the normal high frequency amplifying operation. Further, in the threshold voltage compensator VTHCPS3 shown in FIG. 7, its coupling destination corresponds to the coupling node of the resistors R4 and R8 in a manner similar to the case of FIG. 5. It is therefore possible to realize compensation for a stable threshold voltage in, for example, in middle and high power regions. Since a weighting span of adjustable range for the variation in the threshold voltage extends along with it as compared with the case of FIG. 5, higher accurate compensation can be realized.

Figure 8:
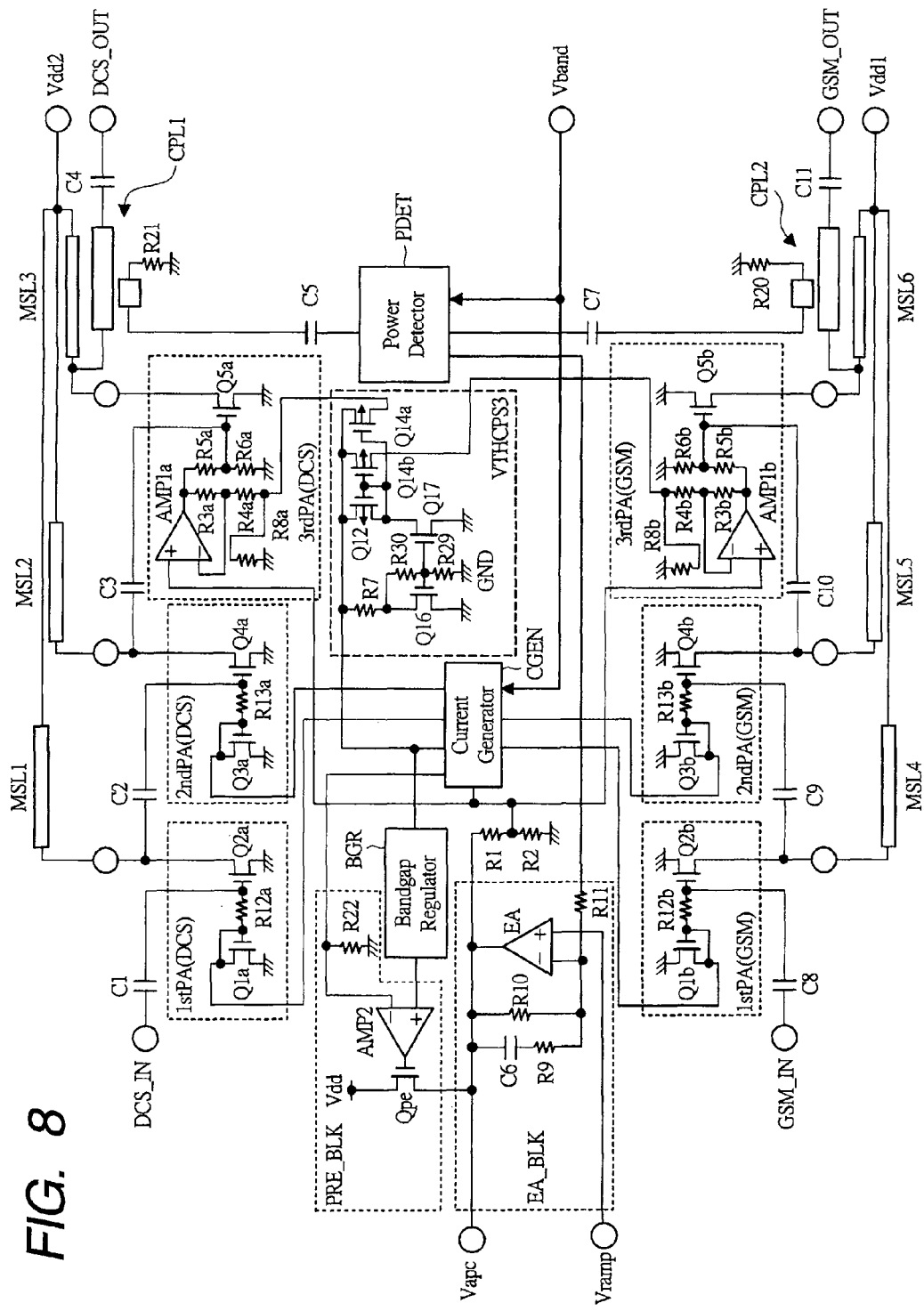
FIG. 8 is a circuit diagram showing an overall configuration example to which the configuration example of FIG. 7 is applied, of the electronic component according to the third embodiment of the present invention.

FIG. 8 is a circuit diagram showing an overall configuration example to which the configuration example of FIG. 7 is applied, of the electronic component according to the third embodiment of the present invention. In a manner similar to the configuration example of FIG. 6, the electronic component shown in FIG. 8 comprises a first power amplifier section for a DCS, a second power amplifier section for a GSM, and an automatic power control circuit section (APC circuit section) for loop-controlling the gain of the first power amplifier section or the second power amplifier section in response to an output level indication signal Vramp. The present configuration example shown in FIG. 8 is different from the configuration example of FIG. 6 in that the configuration example of FIG. 7 is applied to amplifier units 3rdPA (DCS) and 3rdPA (GSM) corresponding to third stages in the first and second power amplifier sections, and the threshold voltage compensator VTHCPS3 of FIG. 7 is applied with its application. Namely, the configuration example of FIG. 8 differs from the configuration example of FIG. 6 only in terms of the configuration lying within the threshold voltage compensator VTHCPS3. Since configurations other than it are similar to those of FIG. 6, their detailed explanations will be omitted.

In the threshold voltage compensator VTHCPS3, two current transfer PMOS transistors Q14a and Q14b are coupled to the gate of the PMOS transistor Q12 shown in FIG. 7. A variation in the threshold voltage of the amplifying NMOS transistor Q5a lying within the amplifier unit 3rdPA (DCS) is compensated by a drain current of the PMOS transistor Q14a. A variation in the threshold voltage of an amplifying NMOS transistor Q5b lying within the amplifier unit 3rdPA (GSM) is compensated by a drain current of the PMOS transistor Q14b. Further, the resistors R29 and R30 are coupled between the drain of the NMOS transistor Q16 and GND as shown in FIG. 7. Here, a power regulator for generating a predetermined voltage (2.75V or the like, for example) using a bandgap voltage (1.2V or the like, for example) is assumed to be included within its corresponding bandgap circuit BGR. The constant voltage circuit VREG in FIG. 7 is implemented by the bandgap circuit BGR.

Figure 9A:
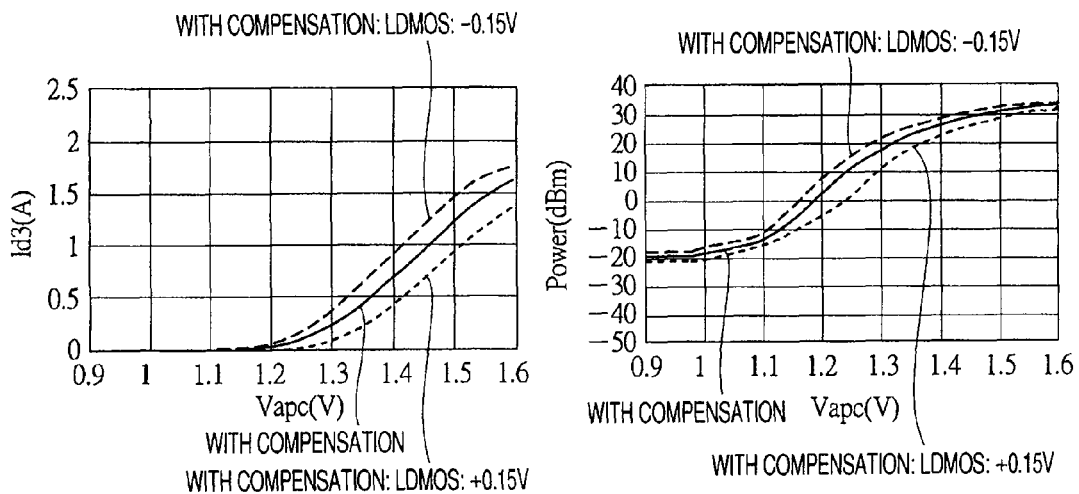
FIG. 9A shows one example of characteristics of the electronic component shown in FIG. 8.
Figure 9B:
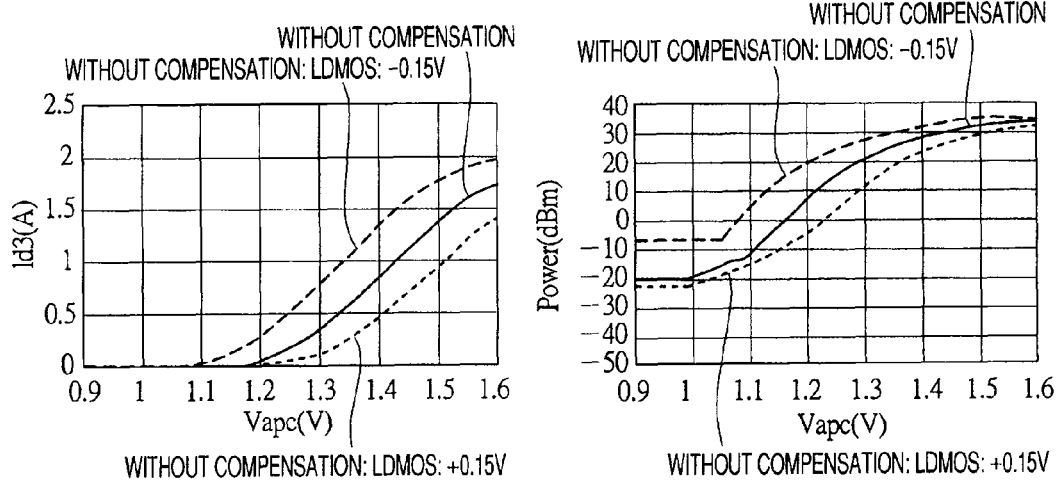
FIG. 9B shows one example of characteristics thereof where a threshold voltage compensator is omitted from FIG. 8, as a target for its comparison.

FIG. 9A shows one example of characteristics of the electronic component shown in FIG. 8, and FIG. 9B shows one example of characteristics thereof where the threshold voltage compensator VTHCPS3 is omitted from FIG. 8, as a target for its comparison. In each of FIGS. 9A and 9B, the characteristics of an output current Id3 relative to a bias control voltage Vapc are shown on the left side, and the characteristics of output power relative to the bias control voltage Vapc are shown on the left side. The present example shows the result of verification using the circuit section of GSM in FIG. 8.

It is understood that as shown on the left side of FIG. 9A, the output current Id3 starts to flow from the time when the bias control voltage Vapc is of a given constant value, regardless of a variation (±0.15V here) in the threshold voltage by using the configuration example of FIG. 8. On the other hand, variations occur in the value of the bias control voltage Vapc where the output current Id3 starts to flow, depending on a variation in the threshold voltage. It is understood that as shown on the right side of FIG. 9A, the output power (i.e., precharge level) in a Vapc low region becomes approximately constant regardless of a variation in the threshold voltage (±0.15V here) by using the configuration example of FIG. 8. On the other hand, variations occur in the precharge level depending on a variation in threshold voltage on the right side of FIG. 9B.

Using the electronic component according to the third embodiment as above makes it possible to obtain an advantageous effect similar to that of the first embodiment, typically, to stabilize the precharge level and implement an improvement in switching spectrum characteristics. In a manner similar to the second embodiment, higher accurate compensation for the threshold voltage can be realized in, for example, middle and high power regions. It is further possible to realize compensation for the threshold voltage, higher in accuracy than that in the second embodiment.

Fourth Embodiment

Figure 10:
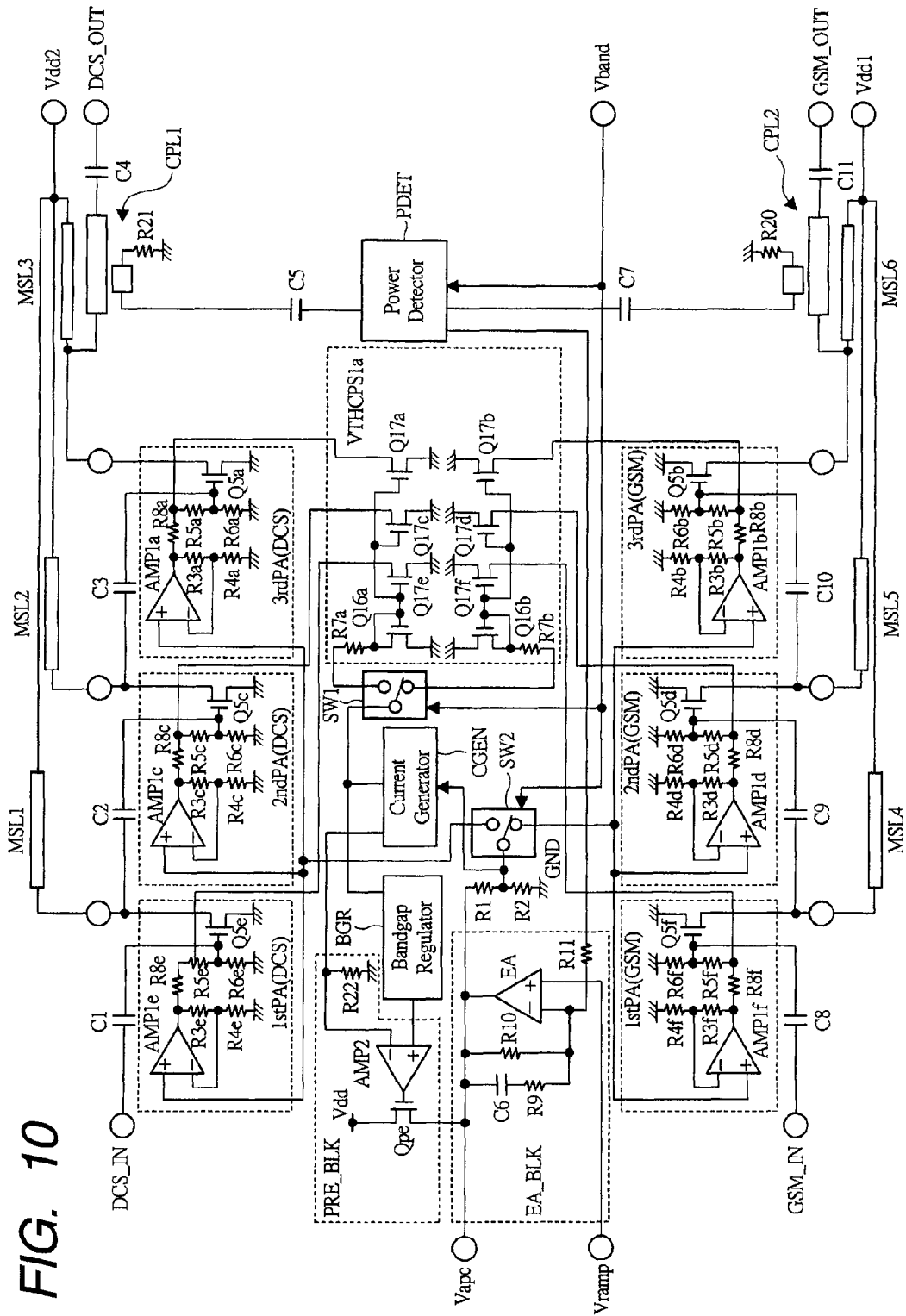
FIG. 10 is a circuit diagram showing a configuration example of an electronic component for high frequency power amplification, according to a fourth embodiment of the present invention.

A fourth embodiment will explain a configuration example in which the configuration example shown in FIG. 1 is applied to all of plural stages of amplifier units. FIG. 10 is a circuit diagram showing a configuration example of an electronic component for high frequency power amplification, according to the fourth embodiment of the present invention. In a manner similar to the configuration example of FIG. 2, the electronic component shown in FIG. 10 comprises a first power amplifier section for a DCS, a second power amplifier section for a GSM, and an automatic power control circuit section (APC circuit section) for loop-controlling the gain of the first power amplifier section or the second power amplifier section in response to an output level indication signal Vramp.

The difference between the configuration example of FIG. 10 and the configuration example of FIG. 2 resides in that the configuration example of FIG. 1 is applied to amplifier units 1stPA (DCS) through 3rdPA (DCS) and 1stPA (GSM) through 3rdPA (GSM) corresponding to first through third stages in the first and second power amplifier sections, and an extended threshold voltage compensator VTHCPS1a of the VTHCPS1 shown in FIG. 1 is provided. Further, the difference therebetween resides in that there are provided switches SW1 and SW2 for performing selecting operations according to a band selection signal Vband. Since configurations other than the above are similar to those of FIG. 2, their detailed explanations will be omitted.

In a manner similar to FIG. 1, the amplifier unit 1stPA (DCS) comprises an amplifying NMOS transistor Q5e, an amplifier AMP1e and resistors R3e through R6e and R8e. Similarly, the amplifier unit 2ndPA (DCS) comprises an amplifying NMOS transistor Q5c, an amplifier AMP1c and resistors R3c through R6c and R8c, and the amplifier unit 3rdPA (DCS) comprises an amplifying NMOS transistor Q5a, an amplifier AMP1a and resistors R3a through R6a and R8a. A high frequency input signal DCS_IN is inputted to a gate of the NMOS transistor Q5e via a capacitor C1. A drain output of the NMOS transistor Q5e is inputted to a gate of the NMOS transistor Q5c via a capacitor C2. A drain output of the NMOS transistor Q5c is inputted to a gate of the NMOS transistor Q5a via a capacitor C3. A drain output of the NMOS transistor Q5a is coupled to a high frequency output signal DCS_OUT via a coupler CPL1 and a capacitor C4. The amplifier units 1stPA (GSM) through 3rdPA (GSM) are also configured in a manner similar to these and amplify a high frequency input signal GSM_IN at respective stages thereof and generate a high frequency output signal GSM_OUT.

The threshold voltage compensator VTHCPS1a has an NMOS transistor Q16a for detecting variations in threshold voltages of the amplifying NMOS transistors Q5a, Q5c and Q5e lying within the first power amplifier section, and an NMOS transistor Q16b for detecting variations in threshold voltages of amplifying NMOS transistors Q5b, Q5d and Q5f lying within the second power amplifier section. Three current transfer NMOS transistors Q17a, Q17c and Q17e are coupled to a gate of the NMOS transistor Q16a. The variations in the threshold voltages of the NMOS transistors Q5a, Q5c and Q5e are respectively compensated by drain currents of the NMOS transistors Q17a, Q17c and Q17e. Three current transfer NMOS transistors Q17b, Q17d and Q17f are coupled to a gate of the NMOS transistor Q16b. The variations in the threshold voltages of the NMOS transistors Q5b, Q5d and Q5f are respectively compensated by drain currents of the NMOS transistors Q17b, Q17d and Q17f.

In this case, the NMOS transistors Q5a, Q5c, Q5e and Q16a are all assumed to be formed in the same process specification, and the NMOS transistors Q5b, Q5d, Q5f and Q16b are all assumed to be formed in the same process specification. The switch SW1 selects, depending on Vband whether a voltage from a bandgap circuit BGR is applied to a resistor R7a coupled to the NMOS transistor Q16a or a resistor R7b coupled to the NMOS transistor Q16b. The switch SW2 selects, depending on Vband whether a voltage obtained by dividing a bias control voltage Vapc by resistors R1 and R2 is supplied to the DCS side (AMP1a, AMP1c and AMP1e) or the GSM side (AMP1b, AMP1d and AMP1f).

Using the electronic component according to the fourth embodiment as above makes it possible to obtain an advantageous effect approximately similar to that of the first embodiment, typically, to achieve the stabilization of a precharge level and realize an improvement in switching spectrum characteristics. As compared with the configuration example of FIG. 2, there is a fear that power stability (accuracy or the like relative to output level indication signal Vramp) is slightly degraded in low and middle power regions in particular. Since, however, all stages are of a voltage control type configuration, it is possible to shorten the time taken to charge and discharge the gate capacitance of each stage and shorten a response delay time for power control. Since, however, the current control type configuration is applied to the first and second stages relatively small in transistor size in the configuration example of FIG. 2, the response delay time becomes trivial practically.

Fifth Embodiment

Figure 11:
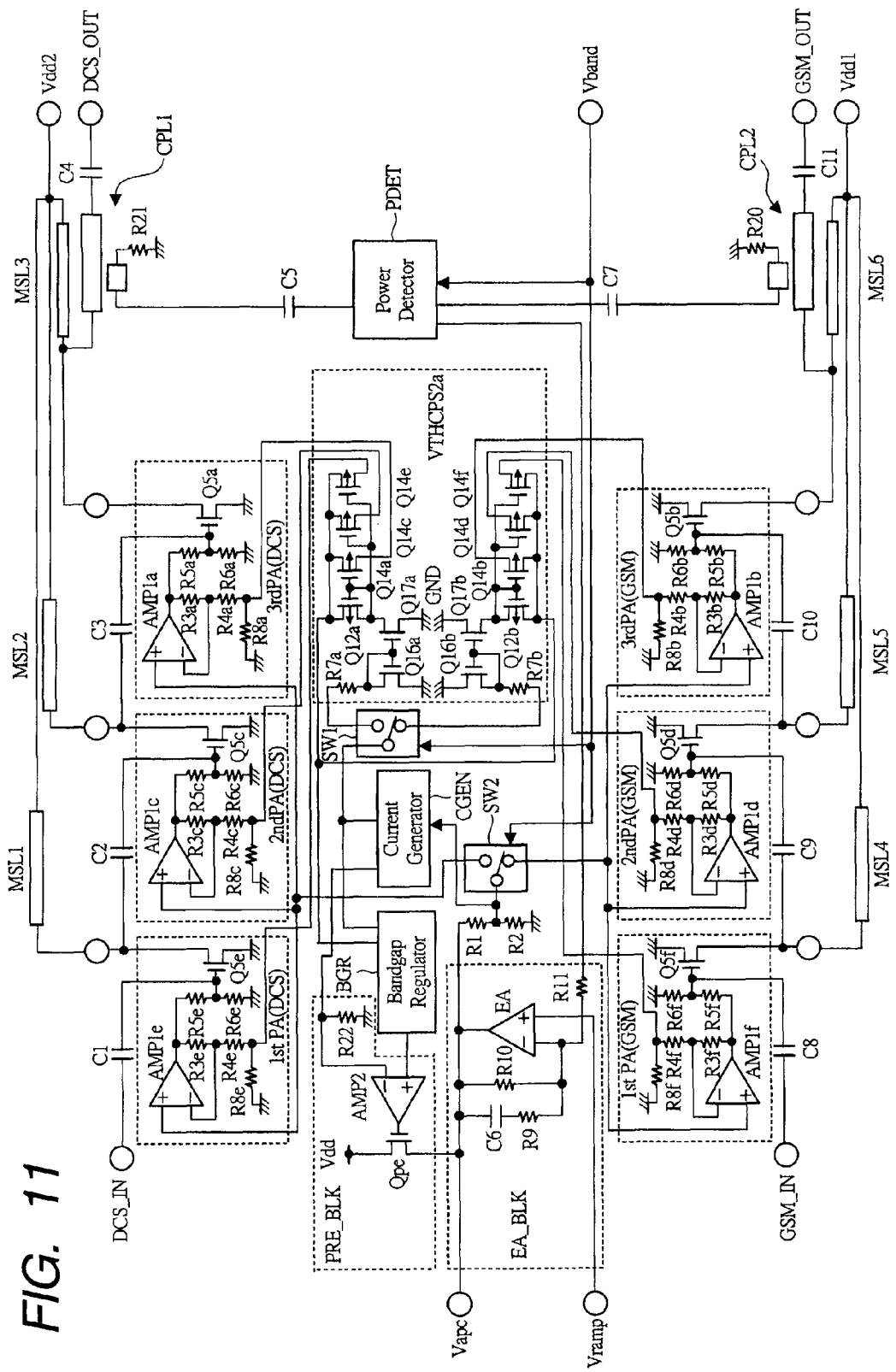
FIG. 11 is a circuit diagram illustrating a configuration example of an electronic component for high frequency power amplification, according to a fifth embodiment of the present invention.

A fifth embodiment will explain a configuration example where the configuration example shown in FIG. 5 is applied to all of plural stages of amplifier units. FIG. 11 is a circuit diagram showing a configuration example of an electronic component for high frequency power amplification, according to the fifth embodiment of the present invention. In a manner similar to the configuration example of FIG. 6, the electronic component shown in FIG. 11 comprises a first power amplifier section for a DCS, a second power amplifier section for a GSM, and an automatic power control circuit section (APC circuit section) for loop-controlling the gain of the first power amplifier section or the second power amplifier section in response to an output level indication signal Vramp.

The difference between the configuration example of FIG. 11 and the configuration example of FIG. 6 resides in that the configuration example of FIG. 5 is applied to amplifier units 1stPA (DCS) through 3rdPA (DCS) and 1stPA (GSM) through 3rdPA (GSM) corresponding to first through third stages in the first and second power amplifier sections, and an extended threshold voltage compensator VTHCPS2a of the VTHCPS2 shown in FIG. 5 is provided. Further, the difference therebetween resides in that there are provided switches SW1 and SW2 for performing selecting operations according to a band selection signal Vband. Since configurations other than the above are similar to those of FIG. 6, their detailed explanations will be omitted.

In a manner similar to FIG. 5, the amplifier unit 1stPA (DCS) comprises an amplifying NMOS transistor Q5e, an amplifier AMP1e and resistors R3e through R6e and R8e. Similarly, the amplifier unit 2ndPA (DCS) comprises an amplifying NMOS transistor Q5c, an amplifier AMP1c and resistors R3c through R6c and R8c, and the amplifier unit 3rdPA (DCS) comprises an amplifying NMOS transistor Q5a, an amplifier AMP1a and resistors R3a through R6a and R8a. A high frequency input signal DCS_IN is inputted to a gate of the NMOS transistor Q5e via a capacitor C1. A drain output of the NMOS transistor Q5e is inputted to a gate of the NMOS transistor Q5c via a capacitor C2. A drain output of the NMOS transistor Q5c is inputted to a gate of the NMOS transistor Q5a via a capacitor C3. A drain output of the NMOS transistor Q5a is coupled to a high frequency output signal DCS_OUT via a coupler CPL1 and a capacitor C4. The amplifier units 1stPA (GSM) through 3rdPA (GSM) are also configured in a manner similar to these and amplify a high frequency input signal GSM_IN at respective stages thereof and generate a high frequency output signal GSM_OUT.

The threshold voltage compensator VTHCPS2a has an NMOS transistor Q16a for detecting variations in threshold voltages of the amplifying NMOS transistors Q5a, Q5c and Q5e lying within the first power amplifier section, and an NMOS transistor Q16b for detecting variations in threshold voltages of amplifying NMOS transistors Q5b, Q5d and Q5f lying within the second power amplifier section. A current of the NMOS transistor Q16a is transferred to an NMOS transistor Q17a and flows even into a PMOS transistor Q12a. Three current transfer PMOS transistors Q14a, Q14c and Q14e are coupled to a gate of the PMOS transistor Q12a. The variations in the threshold voltages of the NMOS transistors Q5a, Q5c and Q5e are respectively compensated by drain currents of the PMOS transistors Q14a, Q14c and Q14e. A current of the NMOS transistor Q16b is transferred to an NMOS transistor Q17b and flows even into a PMOS transistor Q12b. Three current transfer PMOS transistors Q14b, Q14d and Q14f are coupled to a gate of the PMOS transistor Q12b. The variations in the threshold voltages of the NMOS transistors Q5b, Q5d and Q5f are respectively compensated by drain currents of the PMOS transistors Q14b, Q14d and Q14f.

In this case, the NMOS transistors Q5a, Q5c, Q5e and Q16a are all assumed to be formed in the same process specification, and the NMOS transistors Q5b, Q5d, Q5f and Q16b are all assumed to be formed in the same process specification. The switch SW1 selects, depending on Vband whether a voltage from a bandgap circuit BGR is applied to a resistor R7a coupled to the NMOS transistor Q16a or a resistor R7b coupled to the NMOS transistor Q16b. The switch SW2 selects, depending on Vband whether a voltage obtained by dividing a bias control voltage Vapc by resistors R1 and R2 is supplied to the DCS side (AMP1a, AMP1c and AMP1e) or the GSM side (AMP1b, AMP1d and AMP1f).

Using the electronic component according to the fifth embodiment as above makes it possible to obtain an advantageous effect approximately similar to that of the second embodiment, typically, to stabilize a precharge level and realize an improvement in switching spectrum characteristics. As compared with the configuration example of FIG. 6, there is a fear that power stability (accuracy or the like relative to output level indication signal Vramp) is slightly degraded in low and middle power regions in particular. Since, however, all stages are of a voltage control type configuration, it is possible to shorten the time taken to charge and discharge the gate capacitance of each stage and shorten a response delay time for power control. Since, however, the current control type configuration is applied to the first and second stages relatively small in transistor size in the configuration example of FIG. 6, the response delay time becomes trivial practically.

Sixth Embodiment

Figure 12:
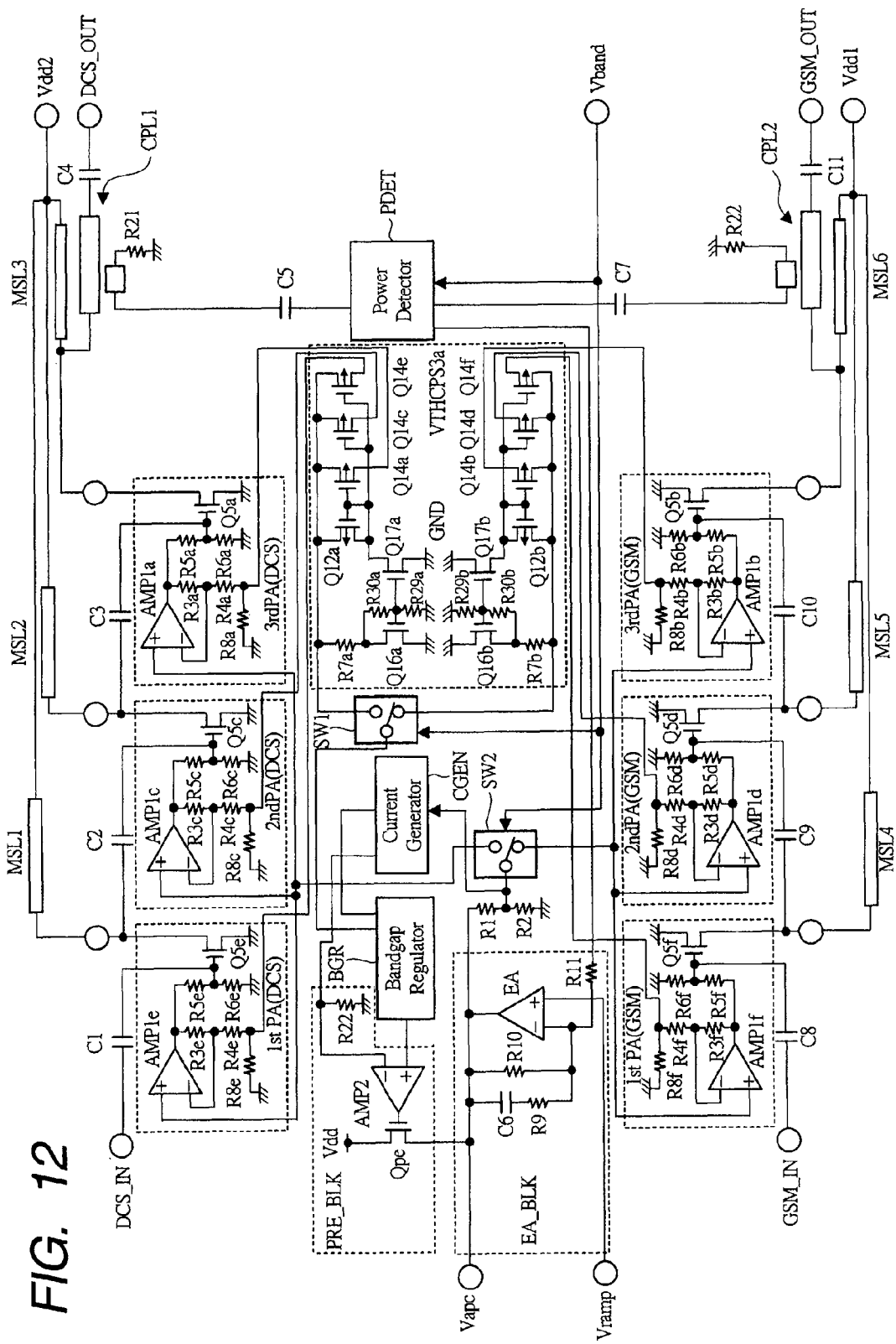
FIG. 12 is a circuit diagram showing a configuration example of an electronic component for high frequency power amplification, according to a sixth embodiment of the present invention.

A sixth embodiment will explain a configuration example where the configuration example shown in FIG. 7 is applied to all of plural stages of amplifier units. FIG. 12 is a circuit diagram showing a configuration example of an electronic component for high frequency power amplification, according to the sixth embodiment of the present invention. In a manner similar to the configuration example of FIG. 8, the electronic component shown in FIG. 12 comprises a first power amplifier section for a DCS, a second power amplifier section for a GSM, and an automatic power control circuit section (APC circuit section) for loop-controlling the gain of the first power amplifier section or the second power amplifier section in response to an output level indication signal Vramp.

The difference between the configuration example of FIG. 12 and the configuration example of FIG. 8 resides in that the configuration example of FIG. 7 is applied to amplifier units 1stPA (DCS) through 3rdPA (DCS) and 1stPA (GSM) through 3rdPA (GSM) corresponding to first through third stages in the first and second power amplifier sections, and an extended threshold voltage compensator VTHCPS3a of the VTHCPS3 shown in FIG. 7 is provided. Further, the difference therebetween resides in that there are provided switches SW1 and SW2 for performing selecting operations according to a band selection signal Vband. Since configurations other than the above are similar to those of FIG. 8, their detailed explanations will be omitted.

In a manner similar to FIG. 7, the amplifier unit 1stPA (DCS) comprises an amplifying NMOS transistor Q5e, an amplifier AMP1e and resistors R3e through R6e and R8e. Similarly, the amplifier unit 2ndPA (DCS) comprises an amplifying NMOS transistor Q5c, an amplifier AMP1c and resistors R3c through R6c and R8c, and the amplifier unit 3rdPA (DCS) comprises an amplifying NMOS transistor Q5a, an amplifier AMP1a and resistors R3a through R6a and R8a. A high frequency input signal DCS_IN is inputted to a gate of the NMOS transistor Q5e via a capacitor C1. A drain output of the NMOS transistor Q5e is inputted to a gate of the NMOS transistor Q5c via a capacitor C2. A drain output of the NMOS transistor Q5c is inputted to a gate of the NMOS transistor Q5a via a capacitor C3. A drain output of the NMOS transistor Q5a is coupled to a high frequency output signal DCS_OUT via a coupler CPL1 and a capacitor C4. The amplifier units 1stPA (GSM) through 3rdPA (GSM) are also configured in a manner similar to these and amplify a high frequency input signal GSM_IN at respective stages thereof and generate a high frequency output signal GSM_OUT.

The threshold voltage compensator VTHCPS3a has an NMOS transistor Q16a for detecting variations in threshold voltages of the amplifying NMOS transistors Q5a, Q5c and Q5e lying within the first power amplifier section, and an NMOS transistor Q16b for detecting variations in threshold voltages of amplifying NMOS transistors Q5b, Q5d and Q5f lying within the second power amplifier section. A current of the NMOS transistor Q16a is transferred to an NMOS transistor Q17a and flows even into a PMOS transistor Q12a. Three current transfer PMOS transistors Q14a, Q14c and Q14e are coupled to a gate of the PMOS transistor Q12a. The variations in the threshold voltages of the NMOS transistors Q5a, Q5c and Q5e are respectively compensated by drain currents of the PMOS transistors Q14a, Q14c and Q14e. A current of the NMOS transistor Q16b is transferred to an NMOS transistor Q17b and flows even into a PMOS transistor Q12b. Three current transfer PMOS transistors Q14b, Q14d and Q14f are coupled to a gate of the PMOS transistor Q12b. The variations in the threshold voltages of the NMOS transistors Q5b, Q5d and Q5f are respectively compensated by drain currents of the PMOS transistors Q14b, Q14d and Q14f.

In this case, the NMOS transistors Q5a, Q5c, Q5e and Q16a are all assumed to be formed in the same process specification, and the NMOS transistors Q5b, Q5d, Q5f and Q16b are all assumed to be formed in the same process specification. The switch SW1 selects, depending on Vband whether a voltage from a bandgap circuit BGR is applied to a resistor R7a and the PMOS transistor Q12a or the like coupled to the NMOS transistor Q16a, or a resistor R7b or the PMOS transistor Q12b or the like coupled to the NMOS transistor Q16b. The switch SW2 selects, depending on Vband whether a voltage obtained by dividing a bias control voltage Vapc by resistors R1 and R2 is supplied to the DCS side (AMP1a, AMP1c and AMP1e) or the GSM side (AMP1b, AMP1d and AMP1f).

Using the electronic component according to the sixth embodiment as above makes it possible to obtain an advantageous effect approximately similar to that of the third embodiment, typically, to achieve the stabilization of a precharge level and realize an improvement in switching spectrum characteristics. As compared with the configuration example of FIG. 8, there is a fear that power stability (accuracy or the like relative to output level indication signal Vramp) is slightly degraded in low and middle power regions in particular. Since, however, all stages are of a voltage control type configuration, it is possible to shorten the time taken to charge and discharge the gate capacitance of each stage and shorten a response delay time for power control. Since, however, the current control type configuration is applied to the first and second stages relatively small in transistor size in the configuration example of FIG. 8, the response delay time is not much of a problem practically.

While the invention made above by the present inventors has been described specifically on the basis of the preferred embodiments, the present invention is not limited to the embodiments referred to above. Various changes can be made thereto within the scope not departing from the gist thereof.

For example, the MOS transistors have been used as the amplifying transistors and the transistors for monitoring the variations in the threshold voltages thereof in the respective embodiments described up to now. They are however not necessarily limited to the MOS transistors, but may be replaced with, for example, bipolar transistors or the like. In this case, manufacturing variations in a base-to-emitter voltage VBE of each amplifying bipolar transistor are monitored by a bipolar transistor formed in the same process specification as the amplifying bipolar transistor. It is needless to say that the MOS (Metal Oxide Semiconductor) transistor can of course be replaced with an MIS (Metal Insulator Semiconductor) transistor.

An electronic component for high frequency power amplification according to each of the preferred embodiments is a technology particularly useful when applied to a power amplifier module of a cellular phone that needs power-up characteristics at the start of transmission with a GSM taken as a representative. The present invention is not limited to it, but can widely be applied to the entirety of a power amplifier module used in a wireless communication system.

What is claimed is:

1. An electronic component for high frequency power amplification, comprising:
   a first transistor which amplifies a high frequency input signal with gain corresponding to a bias control signal and generates a high frequency output signal;
   a power detector which detects output power of the high frequency output signal;
   an error amplifier circuit which compares a result of detection by the power detector and an output level indication signal for setting a value of the output power from outside thereby to control the bias control signal;
   a precharge circuit which controls the bias control signal in such a manner that the output power becomes a fixed value within a range in which the value of the output power becomes small up to such an extent as to be undetectable sufficiently by the power detector;
   a voltage controller which applies a bias voltage corresponding to the bias control signal to the first transistor; and
   a compensator including a monitoring transistor formed in the same process specification as the first transistor, the compensator detecting a change in electrical characteristics with a process variation having occurred even in the monitoring transistor in a manner similar to the first transistor and compensating for the bias voltage, based on the detected signal;
   wherein the first transistor and the monitoring transistor are MIS transistors, and
   wherein the process variation is indicative of a variation in threshold voltage.

2. The electronic component according to claim 1, wherein the voltage controller comprises:
   an amplifier which outputs a voltage proportional to the voltage of the bias control signal by a negative feedback configuration; and
   first, second and third resistors coupled in series sequentially from an output node of the amplifier,
      wherein the bias voltage is generated from a coupling node of the second and third resistors, and
      wherein the compensator causes a current of the monitoring transistor varied based on the variation in the threshold voltage to flow into a coupling node of the first and second resistors.

3. The electronic component according to claim 2, wherein the compensator comprises:
   the monitoring transistor;
   a current transfer transistor which configures a current mirror circuit together with the monitoring transistor;
   a fourth resistor whose one end is coupled to a drain of the monitoring transistor; and
   a constant voltage circuit coupled to the other end of the fourth resistor, and wherein a drain of the current transfer transistor is coupled to the coupling node of the first and second resistors.

4. The electronic component according to claim 1, wherein the voltage controller comprises:
an amplifier which negative feeds back a voltage of an output node thereof via resistance division based on a plurality of dividing resistors and outputs a voltage proportional to the voltage of the bias control signal; and
fifth and sixth resistors coupled in series sequentially from the output node of the amplifier,
wherein the bias voltage is generated from a coupling node of the fifth and sixth resistors, and
wherein the compensator causes the current of the monitoring transistor varied based on the variation in the threshold voltage to flow into any coupling node between the dividing resistors.

5. The electronic component according to claim 4, wherein the compensator comprises:
the monitoring transistor;
a current transfer transistor which configures a first current mirror circuit together with the monitoring transistor;
a second current mirror circuit which outputs a drain current of the current transfer transistor with the direction thereof being changed;
a seventh resistor whose one end is coupled to a drain of the monitoring transistor; and
a constant voltage circuit coupled to the other end of the seventh resistor, and
wherein a current outputted from the second current mirror circuit is caused to flow into any coupling node between the dividing resistors.

6. The electronic component according to claim 5, wherein the compensator further comprises:
an eighth resistor coupled between the drain and gate of the monitoring transistor; and
a ninth resistor coupled between the gate and source of the monitoring transistor.

7. An electronic component for high frequency power amplification, comprising:
a plurality of stages of amplifiers which are coupled in tandem in plural stages and which amplify a high frequency input signal inputted to a first stage with gain corresponding to a bias control signal and generates a high frequency output signal from a final stage;
a first transistor which is included in the amplifier of the final stage and performs an amplifying operation;
a bias voltage controller which applies a bias voltage corresponding to the bias control signal to the first transistor;
a second transistor which is included in the amplifier of the first stage and performs an amplifying operation;
a bias current controller which supplies a bias current corresponding to the bias control signal to the second transistor by a current minor circuit;
a power detector which detects output power of the high frequency output signal;
an error amplifier circuit which compares a result of detection by the power detector and an output level indication signal for setting a value of the output power from outside thereby to control the bias control signal;
a precharge circuit which controls the bias control signal in such a manner that the output power is brought to a fixed value within a range in which the value of the output power becomes small up to such an extent as to be undetectable sufficiently by the power detector; and
a compensator including a monitoring transistor formed in the same process specification as the first transistor, the compensator detecting a change in electrical characteristics with a process variation having occurred even in the monitoring transistor in a manner similar to the first transistor and compensating for the bias voltage of the first transistor, based on the detected signal;
wherein the first transistor and the monitoring transistor are MIS transistors, and
wherein the process variation is indicative of a variation in threshold voltage.

8. The electronic component according to claim 7, wherein the bias voltage controller comprises an amplifier which outputs a voltage proportional to the voltage of the bias control signal by a negative feedback configuration, and first, second and third resistors coupled in series sequentially from an output node of the amplifier,
wherein the bias voltage is generated from a coupling node of the second and third resistors, and
wherein the compensator causes a current of the monitoring transistor varied based on the variation in the threshold voltage to flow into a coupling node of the first and second resistors.

9. The electronic component according to claim 7, wherein the bias voltage controller comprises:
an amplifier which negative feeds back a voltage of an output node thereof via resistance division based on a plurality of dividing resistors and outputs a voltage proportional to the voltage of the bias control signal; and
fifth and sixth resistors coupled in series sequentially from the output node of the amplifier,
wherein the bias voltage is generated from a coupling node of the fifth and sixth resistors, and
wherein the compensator causes the current of the monitoring transistor varied based on the variation in the threshold voltage to flow into any coupling node between the dividing resistors.

* * * * *